United States Patent
Hussein

(10) Patent No.: US 12,038,482 B1
(45) Date of Patent: Jul. 16, 2024

(54) SYSTEM AND METHOD FOR DETERMINING CAPACITY OF BATTERY CELL

(71) Applicant: Prince Mohammad Bin Fahd University, Dhahran (SA)

(72) Inventor: Ala A. Hussein, Dhahran (SA)

(73) Assignee: Prince Mohammad Bin Fahd University, Dhahran (SA)

( * ) Notice: Subject to any disclaimer, the term of this patent is extended or adjusted under 35 U.S.C. 154(b) by 0 days.

(21) Appl. No.: 18/605,433

(22) Filed: Mar. 14, 2024

(51) Int. Cl.
| | | |
|---|---|---|
| G01R 31/374 | (2019.01) | |
| G01R 31/3835 | (2019.01) | |
| G01R 31/396 | (2019.01) | |
| H01M 10/0525 | (2010.01) | |
| H01M 10/42 | (2006.01) | |
| H01M 10/44 | (2006.01) | |
| H02J 7/00 | (2006.01) | |

(52) U.S. Cl.
CPC ....... *G01R 31/374* (2019.01); *G01R 31/3835* (2019.01); *G01R 31/396* (2019.01); *H01M 10/0525* (2013.01); *H01M 10/425* (2013.01); *H01M 10/441* (2013.01); *H02J 7/0048* (2020.01); *H01M 2010/4271* (2013.01)

(58) Field of Classification Search
None
See application file for complete search history.

(56) References Cited

U.S. PATENT DOCUMENTS

| | | | |
|---|---|---|---|
| 2013/0080094 A1* | 3/2013 | Teng | H01M 10/425 702/85 |
| 2023/0375635 A1 | 11/2023 | Noland et al. | |

FOREIGN PATENT DOCUMENTS

| | | |
|---|---|---|
| CN | 111308377 A | 6/2020 |
| CN | 112462283 A | 3/2021 |

OTHER PUBLICATIONS

Yang et al.; Lithium-ion battery capacity estimation based on battery surface temperature change under constant-current chare scenario; Energy 241; Dec. 11, 2021; 13 Pages.
Tian et al.; State-of-Health Estimation Based on Differential Temperature for Lithium Ion Batteries; IEEE Transactions on Power Electronics, vol. 35, Issue 10; Mar. 5, 2020 ;Abstract Only; 4 Pages.
Che et al.; Battery health prognostic with sensor-free differential temperature voltammetry reconstruction and capacity estimation based on multi-domain adaptation; eTransportation 17; Apr. 7, 2023; 12 Pages.

* cited by examiner

*Primary Examiner* — Jas A Sanghera
(74) *Attorney, Agent, or Firm* — Oblon, McClelland, Maier & Neustadt, L.L.P.

(57) ABSTRACT

Methods for determining the capacity of a battery cell, including a lithium-ion battery cell, and a plurality of battery cells include measuring surface temperature and voltage of the battery cell(s). Then, a constant-current discharge cycle is conducted. Subsequently, final surface temperature and voltage are measured. These measurements enable calculating the battery temperature rise value and the maximum differential temperature value. An empirical method determines the differential temperature gain value. From these values, a capacity parameter is calculated. Then, a differential voltage value is derived from the initial and final battery cell voltages. Further, first, second, and third capacity coefficients are empirically determined, allowing the calculation of the capacity of the battery cell(s).

20 Claims, 11 Drawing Sheets

SYSTEM AND METHOD FOR DETERMINING CAPACITY OF BATTERY CELL

STATEMENT OF PRIOR DISCLOSURE BY AN INVENTOR

Aspects of this technology are described in "An Empirical Capacity Estimation Model for Lithium-ion Battery Cells Using Surface Temperature and Terminal Voltage Measurements", presented at the 2023 IEEE Applied Power Electronics Conference and Exposition on Mar. 21, 2023, which is also incorporated herein by reference in its entirety.

BACKGROUND

Technical Field

The present disclosure is directed to the field of battery technology, specifically to methods for assessing battery cell capacity, including lithium-ion battery cells.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

Accurate assessment of battery cells capacity is important for ensuring reliability and efficiency in a wide range of applications, from consumer electronics to electric vehicles and energy storage systems. A variety of methodologies are traditionally utilized for determining battery health and capacity in the art, primarily focusing on direct measurement techniques and predictive modeling based on electrical parameters. However, these traditional approaches face multiple challenges related to precision and practicality, particularly as batteries age and their internal resistance changes. The inherent variability in battery performance and the impacts of operational conditions often lead to inaccuracies in capacity estimation, which may in turn negatively impact the overall efficiency and reliability of battery-powered systems.

While some advanced models for determining battery capacity exist, they typically involve complex algorithms that depend on a plurality of measurements which often include voltage, current, temperature data. Furthermore, these methods may also include coulomb counting, impedance spectroscopy, or the use of health indicators derived from electrical tests. While providing some insight into battery status, these approaches often need extensive computational resources, specialized equipment, and may require interrupting normal operation of the battery for testing. Even still, these approaches fail to accurately account for the effects of aging and usage patterns on battery capacity, leading to significant discrepancies between estimated and actual capacities. Furthermore, the need for specialized diagnostic equipment or the interruption of normal battery operation for testing poses significant practical constraints, especially for embedded or critical battery applications where continuous operation is essential.

CN Patent Reference No. 112462283A discloses a lithium ion battery internal resistance and capacity estimation method based on a differential temperature curve, which comprises the following steps: obtaining a battery differential temperature curve off line; establishing a correlation relation between the characteristic variables in the battery differential temperature curve and the internal resistance and capacity of the battery; and estimating the internal resistance and the capacity of the lithium ion battery on line.

CN Patent Reference No. 111308377A discloses a method and a system for detecting the health of a battery based on temperature voltage differentiation, comprising the following steps: acquiring training sample data; training the Gaussian process regression model according to the training sample data to obtain an off-line Gaussian process regression model; acquiring the terminal voltage and the surface temperature of the battery at the current moment; determining a temperature voltage differential curve according to the data at the current moment; filtering the temperature voltage differential curve by adopting a moving average filtering algorithm to obtain a filtered temperature voltage differential curve; determining a battery characteristic value according to the filtered temperature-voltage differential curve; inputting the characteristic value of the battery into an off-line Gaussian process regression model to obtain a current health state detection result of the battery; and calibrating the characteristic value of the battery according to the detection result to be used as updating data, updating the off-line Gaussian process regression model, and detecting the health state of the battery at the next moment by adopting the updated Gaussian process regression model.

US Patent Reference No. 20230375635A1 discloses a method for determining the state of health of a battery on a vehicle, the method includes the steps of: identifying an SOH testing segment on which the battery may be charged at a known charging rate for a predetermined duration, and determining an increase in voltage based on the charging rate, time duration, an internal resistance of the battery, and/or a battery temperature differential over the time duration.

Each of the aforementioned references suffers from one or more drawbacks which has hindered their adoption. Therefore, there is a need for a solution that can offer accurate, reliable, and practical battery capacity estimations without the need for a large number of sensors or expensive materials. Such a solution needs to leverage readily available operational data, minimize the need for specialized equipment, and enable seamless integration into existing battery management systems without disrupting normal operation. The present disclosure aims to address these gaps by providing methods for determining the capacity of battery cells, with enhanced accuracy, ease of implementation, and operational efficiency.

SUMMARY

In an embodiment, a method for determining the capacity of a battery cell is provided. The method comprises measuring an initial battery cell surface temperature of the battery cell at an initial time. The method further comprises measuring an initial ambient temperature at the initial time. The method further comprises measuring an initial battery cell voltage of the battery cell at the initial time. The method further comprises conducting a constant-current discharge cycle on the battery cell, the constant-current discharge cycle occurring from the initial time to a final time. The method further comprises measuring a final battery cell surface temperature of the battery cell at the final time. The method further comprises measuring a final ambient temperature at the final time. The method further comprises measuring a final battery cell voltage of the battery cell at the final time. The method further comprises calculating a battery temperature rise value from the initial battery cell surface temperature, the initial ambient temperature, the final battery cell surface temperature, and the final ambient temperature. The method further comprises calculating a maximum differential temperature value from the highest recorded battery cell surface temperature which occurs before the battery cell surface temperature begins to decrease. The method further comprises determining a differential temperature gain value empirically. The method further comprises calculating a capacity parameter from the maximum differential temperature value, the battery temperature rise value, and the differential temperature gain value. The method further comprises calculating a differential voltage value from the initial battery cell voltage and the final battery cell voltage. The method further comprises determining a first capacity coefficient, a second capacity coefficient, and a third capacity coefficient empirically. The method further comprises calculating the capacity of the battery cell from the differential voltage value, the capacity parameter, the first capacity coefficient, the second capacity coefficient, and the third capacity coefficient.

In some embodiments, the differential temperature gain value is determined empirically after at least 100 charge-discharge cycles have been completed and no more than 1000 charge-discharge cycles have been completed.

In some embodiments, the battery cell is a lithium-ion battery cell.

In some embodiments, a low-pass filter is used to remove high-frequency noise present in the differential temperature value.

In some embodiments, the low-pass filter uses a subset of differential temperature values to calculate the average differential temperature value at an instant time.

In some embodiments, the capacity of the battery cell is determined without fully discharging the battery cell.

In some embodiments, the capacity of the battery cell is determined without fully charging the battery cell.

In some embodiments, the capacity of the battery is determined while the battery is operating at a specific, known operating temperature.

In some embodiments, the capacity of the battery cell is measured at a regular interval and the capacity of the battery cell is recorded in a computer readable medium as a battery cell capacity timestamp.

In some embodiments, the capacity of the battery cell over time is determined by comparing a first battery cell capacity timestamps against a second battery cell capacity timestamp, the first battery cell capacity timestamp being recorded at a first time and the second battery cell capacity timestamp being recorded at a second time.

In some embodiments, the capacity of the battery cell is determined by a battery management system.

In some embodiments, the initial battery cell surface temperature, the final battery cell surface temperature, the initial ambient temperature, and the final ambient temperature are measured with the same temperature sensor.

In another embodiment, a method for determining the capacity of a lithium-ion battery is provided. The method comprises measuring an initial battery surface temperature of the lithium-ion battery at an initial time. The method further comprises measuring an initial ambient temperature at the initial time. The method further comprises measuring an initial battery voltage of the lithium-ion battery at the initial time. The method further comprises conducting a constant-current discharge cycle on the lithium-ion battery, the constant-current discharge cycle occurring from the initial time to a final time. The method further comprises measuring a final battery surface temperature of the lithium-ion battery at the final time. The method further comprises measuring a final ambient temperature at the final time. The method further comprises measuring a final battery voltage of the lithium-ion battery at the final time. The method further comprises calculating a battery temperature rise value from the initial battery surface temperature, the initial ambient temperature, the final battery surface temperature, and the final ambient temperature. The method further comprises calculating a maximum differential temperature value from the highest recorded battery surface temperature which occurs before the battery surface temperature begins to decrease. The method further comprises determining a differential temperature gain value empirically. The method further comprises calculating a capacity parameter from the maximum differential temperature value, the battery temperature rise value, and the differential temperature gain value. The method further comprises calculating a differential voltage value from the initial battery voltage and the final battery voltage. The method further comprises determining a first capacity coefficient, a second capacity coefficient, and a third capacity coefficient empirically. The method further comprises calculating the capacity of the lithium-ion battery from the differential voltage value, the capacity parameter, the first capacity coefficient, the second capacity coefficient, and the third capacity coefficient.

In some embodiments, a low-pass filter is used to remove the high-frequency noise present in the differential temperature value.

In some embodiments, the low-pass filter uses a subset of differential temperature values to calculate the average differential temperature value at an instant time.

In some embodiments, the capacity of the lithium-ion battery is determined without fully charging or fully discharging the lithium-ion battery.

In some embodiments, the lithium-ion battery is comprised of a plurality of lithium-ion battery cells.

In yet another embodiment, a method for determining the overall capacity of a plurality of battery cells is provided. The method comprises measuring a first initial battery cell surface temperature of a first battery cell at an initial time. The method further comprises measuring a second initial battery cell surface temperature of a second battery cell at the initial time. The method further comprises measuring an initial ambient temperature at the initial time. The method further comprises measuring a first initial battery cell voltage of the first battery cell at the initial time. The method further comprises measuring a second initial battery cell voltage of the second battery cell at the initial time. The method further comprises conducting a constant-current discharge cycle on the plurality of battery cells, the constant-current discharge cycle occurring from the initial time to a final time. The method further comprises measuring a first final battery cell surface temperature of the first battery cell at the final time. The method further comprises measuring a second final battery cell surface temperature of the second battery cell at the final time. The method further comprises measuring a final ambient temperature at the final time. The method further comprises measuring a first final battery cell voltage of the first battery cell at the final time. The method further comprises measuring a second final battery cell voltage of the second battery cell at the final time. The method further comprises calculating a first battery temperature rise value from the first initial battery cell surface temperature, the initial ambient temperature, the first final battery cell surface temperature, and the final ambient temperature. The method further comprises calculating a second battery temperature rise value from the second initial battery cell surface temperature, the initial ambient temperature, the second final battery cell surface temperature, and the final ambient temperature. The method further comprises calculating a first maximum differential temperature value from the highest recorded first battery cell surface temperature which occurs before the first battery cell surface temperature begins to decrease. The method further comprises calculating a second maximum differential temperature value from the highest recorded second battery cell surface temperature which occurs before the second battery cell surface temperature begins to decrease. The method further comprises determining a differential temperature gain value empirically. The method further comprises calculating a first capacity parameter from the first maximum differential temperature value, the first battery temperature rise value, and the differential temperature gain value. The method further comprises calculating a second capacity parameter from the second maximum differential temperature value, the second battery temperature rise value, and the differential temperature gain value. The method further comprises calculating a first differential voltage value from the first initial battery cell voltage and the first final battery cell voltage. The method further comprises calculating a second differential voltage value from the second initial battery cell voltage and the second final battery cell voltage. The method further comprises determining a first capacity coefficient, a second capacity coefficient, and a third capacity coefficient empirically. The method further comprises calculating the overall capacity of the plurality of battery cells from the first differential voltage value, the second differential voltage value, the first capacity parameter, the second capacity parameter, the first capacity coefficient, the second capacity coefficient, and the third capacity coefficient.

In some embodiments, the plurality of battery cells are lithium-ion battery cells.

In some embodiments, a low-pass filter is used to remove the high-frequency noise present in the differential temperature value, the low-pass filter being configured to use a subset of differential temperature values to calculate an average differential temperature value at an instant time.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
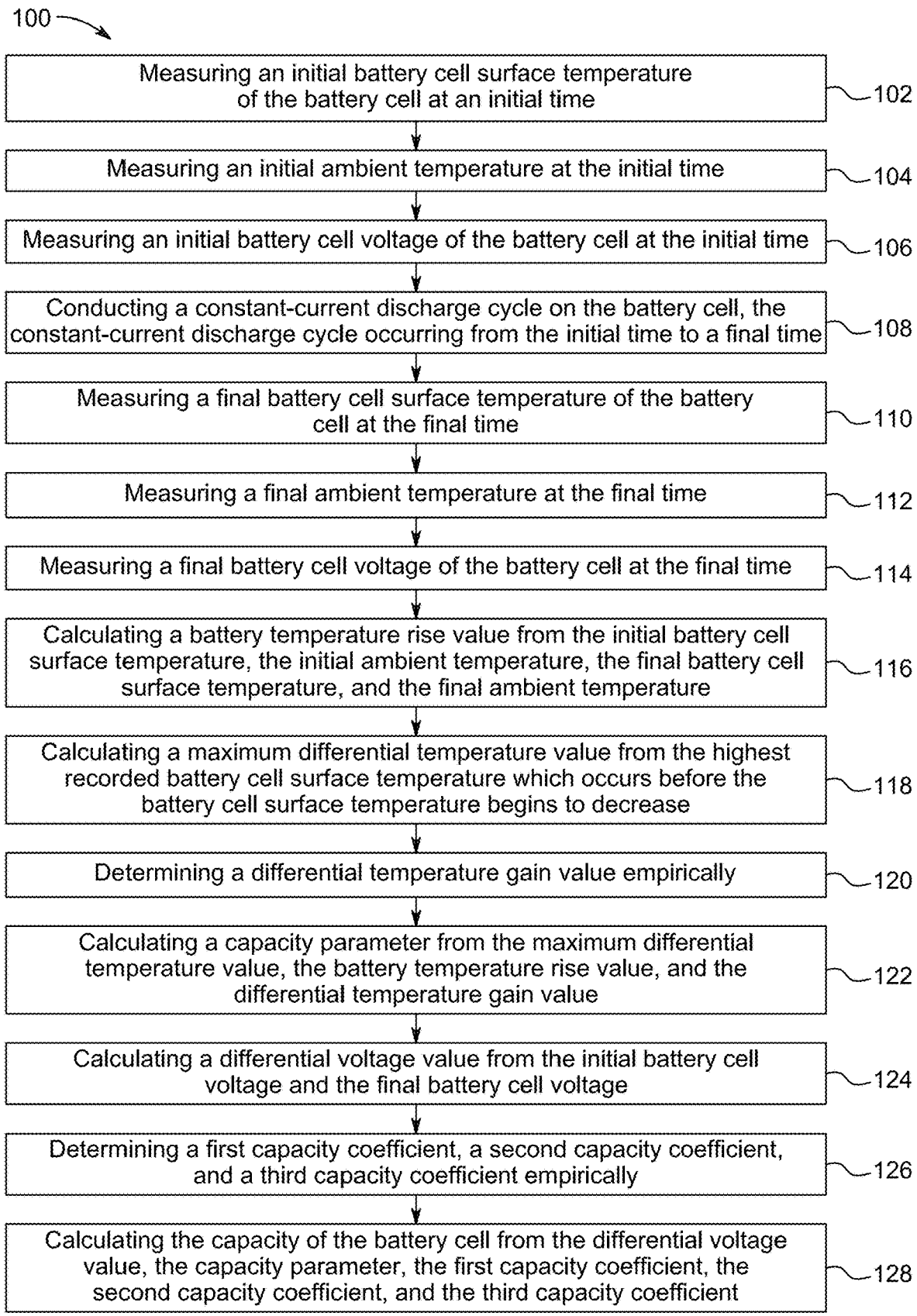
FIG. 1 is an exemplary flowchart listing steps involved in a method for determining the capacity of a battery cell, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to methods for determining the capacity of battery cells, including, but not limited to, lithium-ion battery cells, by utilizing temperature measurements in conjunction with voltage readings. This approach leverages the correlation between the temperature response of the battery cells during operation and their current capacity. Specifically, the present disclosure involves calculating a differential temperature gain value and employing this parameter in a capacity estimation model. This technique provides a more accurate, cost-effective, and easily implementable solution compared to existing methods.

Referring to FIG. 1, illustrated is a flowchart of a method (as represented by reference numeral 100) for determining the capacity of a battery cell, per embodiments of the present disclosure. In the present context, the "battery cell" may refer to a basic electrochemical unit that converts chemical energy into electrical energy, capable of being charged and discharged. The battery cell, typically, includes an anode, a cathode, an electrolyte, and a separator. The capacity of a battery cell refers to the amount of electrical charge it can store and deliver at a specified voltage, typically measured in ampere-hours (Ah). This capacity is an indicator of health and operational efficiency of the battery cell, defining its ability to power devices or systems over a given period.

For purposes of the present disclosure, the battery cell may be a lithium-ion battery cell. Lithium-ion (Li-ion) technology is one of the most advanced types of rechargeable battery chemistry and is used in a wide array of applications, from portable electronics to electric vehicles and large-scale energy storage systems. Such battery cells are characterized by their high energy density, relatively low self-discharge rate, and ability to sustain multiple charge-discharge cycles with minimal degradation when compared to other battery types. The method 100 of the present disclosure is designed to address the unique characteristics of Li-ion battery cells, ensuring that determination of capacity of such battery cells is accurate and reflective of their specific operational behaviors. That said, it may be appreciated that the teachings of the present disclosure may be applied to other types of battery cells without departing from the spirit and the scope of the present disclosure.

Figure 4A:
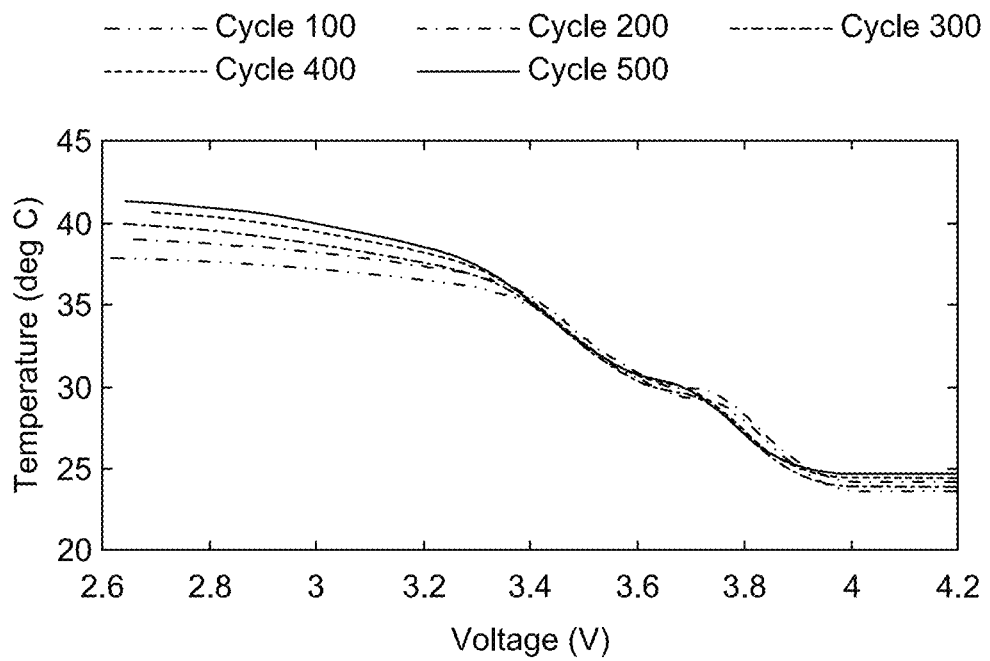
FIG. 4A is an exemplary graph showing a relationship between the temperature rise of B0005 battery cells and their voltage outputs, providing temperature-voltage curves, across multiple charge-discharge cycles, according to certain embodiments.
Figure 4B:
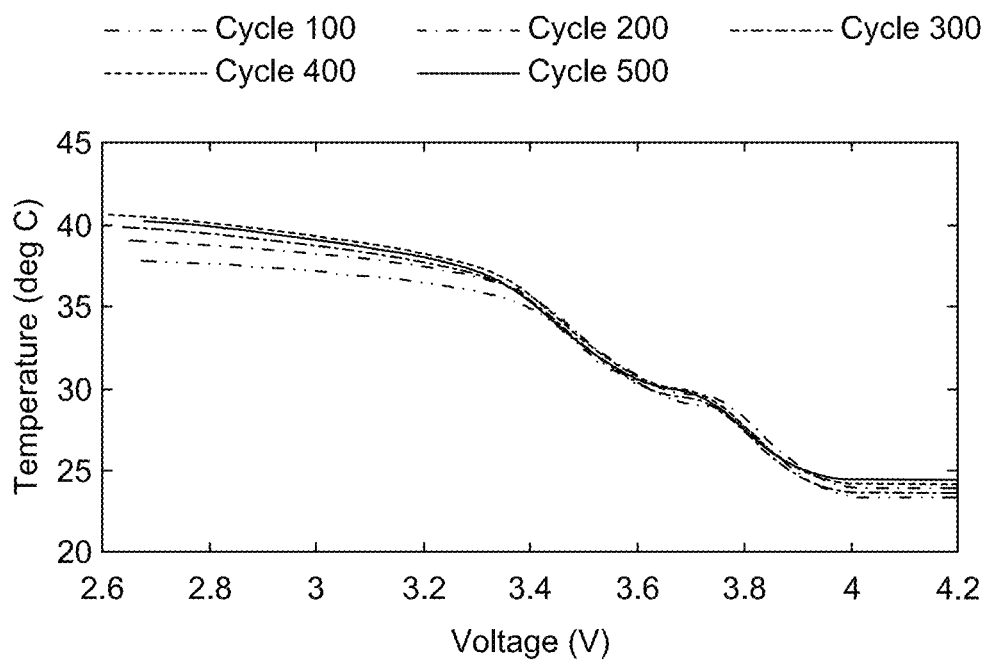
FIG. 4B is an exemplary graph showing a relationship between the temperature rise of B0007 battery cells and their voltage outputs, providing temperature-voltage curves, across multiple charge-discharge cycles, according to certain embodiments.

It has been observed that as battery cells age, their internal resistance increases, leading to a rise in heat generation internally due to increased power losses (I2R losses). This characteristic thermal change has been identified to have a direct correlation with the frequency of cycling of the battery cell, i.e., its charge and discharge occurrences. This relationship has been confirmed through empirical evidence derived from the operational data of commercial lithium-ion battery cells, as illustrated in FIGS. 4A and 4B. Specifically, FIGS. 4A and 4B provide empirical data showing the relationship between the temperature rise of battery cells and their voltage outputs across multiple charge-discharge cycles. The graphs demonstrate that as a battery cell undergoes more cycles, from the 100th to the 500th, there is a noticeable increase in temperature for the same voltage output, indicating a rise in internal resistance and corresponding power losses. This suggest a quantifiable relationship between thermal and electrical characteristics that can be leveraged to assess battery health and capacity with precision, as has been exploited in the method 100 of the present disclosure.

At step 102, the method 100 includes measuring an initial battery cell surface temperature of the battery cell at an initial time. The battery cell surface temperature may refer to the temperature measured directly on a surface of the battery cell, indicating its thermal state during operation or at rest. This involves recording the temperature on the surface (typically, outer surface) of the battery cell at a designated starting point in time, using a temperature sensor. The battery cell surface temperature may also be an estimate of the temperature at the battery surface as measured by another temperature probe or through another method for determining temperature. This measurement provides a baseline for understanding the thermal behavior of the battery cell under subsequent operational conditions. At step 104, the method 100 includes measuring an initial ambient temperature at the initial time. The ambient temperature may be the temperature of the environment surrounding the battery cell, which can influence thermal behavior and performance of the battery cell. The ambient temperature may also be an estimate of the temperature of the environment surrounding the battery cell. Herein, the temperature of the environment surrounding the battery cell is measured at the same initial time, simultaneous to the measurement of the initial battery cell surface temperature of the battery cell. This helps in distinguishing the thermal effects due to battery operation from those resulting from environmental temperature changes. At step 106, the method 100 includes measuring an initial battery cell voltage of the battery cell at the initial time. The battery cell voltage is the electrical potential difference across the terminals of the battery cell, indicating its charge state and energy content. The voltage across the terminals of the battery cell is also recorded at the same initial time. This voltage measurement serves as a reference point for assessing the electrical state and potential energy content of the battery cell at the beginning of the evaluation process. Each of these measurements establishes a baseline against which changes in temperature, voltage, and ultimately capacity of the battery cell may be assessed.

In present embodiments, the initial battery cell surface temperature, the final battery cell surface temperature, the initial ambient temperature, and the final ambient temperature are measured with the same temperature sensor. It may be appreciated that for determining the capacity of the battery cell, the consistency and accuracy of temperature measurements are important factors. To ensure this, the initial and final battery cell surface temperatures, as well as the initial and final ambient temperatures, are measured using the same temperature sensor. Utilizing the same temperature sensor for all temperature-related measurements eliminates the variability that could be introduced by using multiple devices, which may have differing calibration settings or sensitivities.

At step 108, the method 100 includes conducting a constant-current discharge cycle on the battery cell, the constant-current discharge cycle occurring from the initial time to a final time. This technique involves discharging the battery cell at a consistent current from the initial time, when the initial measurements are taken, to the final time, where the subsequent measurements will be made. The use of the constant current ensures uniformity in the discharge process, allowing for accurate comparison of behavior of the battery over the duration of the test. By maintaining a steady current, the method 100 avoids the variability that may be introduced by fluctuating discharge rates, which could otherwise lead to inaccuracies in the measurement of the capacity of the battery cell.

It may be understood that the constant-current discharge cycle facilitates a controlled environment in which the response of the battery cell, specifically its voltage and temperature changes, may be accurately monitored and recorded. The constant current ensures that any changes in these parameters are due to intrinsic properties of the battery cell and its state of charge rather than external influences or operational inconsistencies. The result of this step 108 is a set of data points that represent thermal and electrical response of the battery cell under defined and controlled discharge. This data may, then, be utilized for applying empirical models which correlate these responses to capacity of the battery cell, providing an accurate and reliable measure of the current state and health of the battery cell (as discussed in the subsequent paragraphs in more detail).

At step 110, the method 100 includes measuring a final battery cell surface temperature of the battery cell at the final time. That is, at the conclusion of the discharge cycle, the surface temperature of the battery cell is again measured. The final battery cell surface temperature is the temperature recorded on the surface of the battery cell at the end of the constant-current discharge cycle, indicative of thermal state, post-discharge, of the battery cell. The final battery cell surface temperature, when compared to the initial battery cell surface temperature, represents the thermal energy released by the battery, due to internal resistance, during the discharge process. This thermal response is an indicator of the current health and capacity of the battery cell. At step 112, the method 100 includes measuring a final ambient temperature at the final time. Simultaneously, the ambient temperature surrounding the battery cell is recorded at the final time to ensure that any changes in temperature of the battery cell are not due to environmental variations. This control measurement is used to isolate the thermal behavior of the battery cell throughout the discharge cycle. At step 114, the method 100 includes measuring a final battery cell voltage of the battery cell at the final time. Additionally, the voltage of the battery cell is measured at the final time, providing a data point that represents the electrical state of the battery cell after the discharge cycle. The final battery cell voltage is the electrical potential measured across the battery cell at the end of the discharge cycle, which is a direct indicator of its discharged state. The final battery cell voltage, when compared to the initial battery cell voltage, represents the electrical discharge characteristics of the battery cell and is used in calculating the capacity of the battery cell.

At step 116, the method 100 includes calculating a battery temperature rise value from the initial battery cell surface temperature, the initial ambient temperature, the final battery cell surface temperature, and the final ambient temperature. This calculation is designed to isolate the thermal effects of the activity of the battery cell from ambient conditions. It takes into account the initial battery cell surface temperature and the initial ambient temperature, measured at the start of the constant-current discharge cycle (i.e., initial time), as well as the final battery cell surface temperature and the final ambient temperature, measured at the conclusion of the constant-current discharge cycle (i.e., final time). The battery temperature rise value is a representation of the heat generated by the battery cell due to internal processes and reactions during the discharge cycle.

It may be understood that the above measurements allow the method to avoid interpreting the rise in ambient temperature as a rise in the battery temperature, as the difference between the measured surface temperature of the battery cell at a specific instant and the ambient temperature at the same instant is considered. Here, the temperature rise is defined in equation (1) below, where $T_r$ is the battery temperature rise value, $T_{bf}$ is the final battery cell surface temperature, $T_{af}$ is the final ambient temperature, $T_{bi}$ is the initial battery cell surface temperature, and $T_{ai}$ is the initial ambient temperature. The initial and final temperature measurements are taken at the start and end of a constant-current discharge cycle.

$$T_r = (T_{bf} - T_{af}) - (T_{bi} - T_{ai}) \quad (1)$$

That is, to calculate the battery temperature rise value, the difference between the final battery cell surface temperature and the initial battery cell surface temperature is determined, which gives the total temperature change of the battery cell surface over the course of the discharge. Then, to ensure that this value represents only the temperature changes due to internal heat generation of the battery cell and not external temperature fluctuations, the change in ambient temperature (final ambient temperature minus initial ambient temperature) is subtracted from the total temperature change of the battery cell surface. The resulting figure represents the battery temperature rise value, which is a parameter for determining the capacity of the battery cell. This value is indicative of the internal resistance and efficiency of the battery cell; a higher temperature rise typically suggests greater energy loss to heat, which could imply lower capacity and efficiency.

One challenge in using the temperature-rise alone for capacity estimation is that, although the capacity and temperature-rise are correlated, their correlation is not sufficiently strong to obtain accurate capacity estimates. For example, several capacity values may exist at the same temperature-rise value. This can be observed by examining the temperature-rise characteristics of two independent Li-ion battery cells for 500 cycles. Hence, another parameter has been identified that can be used to enhance the accuracy of the capacity estimation model. This parameter, the differential temperature ($\Delta T$), is given in equation (2) below, where k is the time index of the temperature measurement.

$$\Delta T_k = T_k - T_{k-1} \quad (2)$$

Figure 5A:
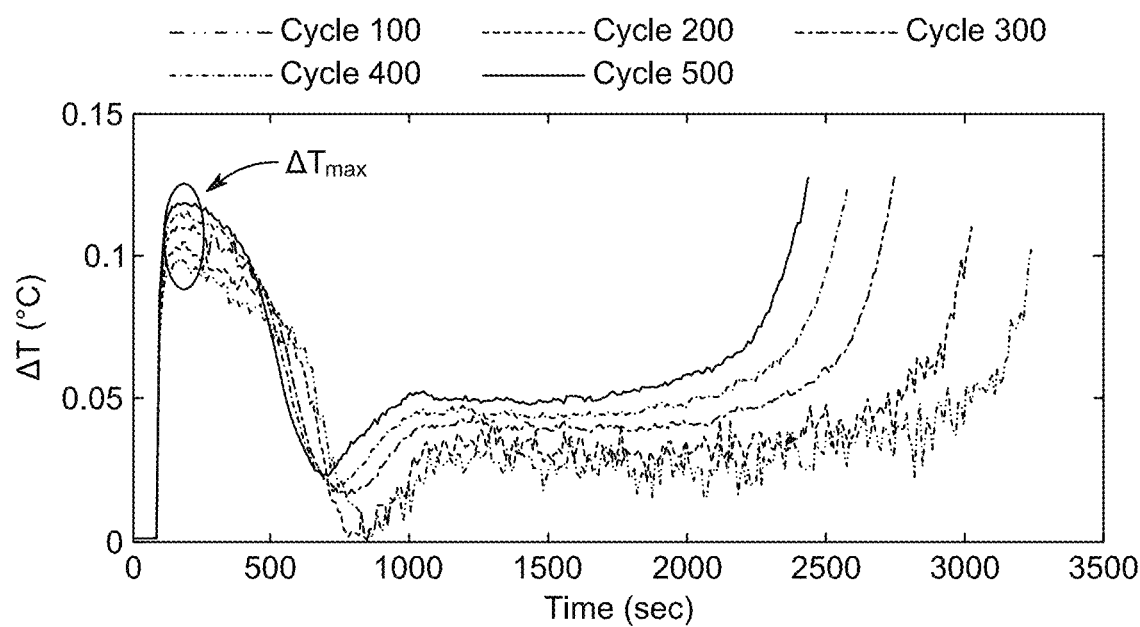
FIG. 5A is an exemplary graph showing differential temperature (47) curves for cycles 100 through 500 for B0005 battery cells, according to certain embodiments.
Figure 5B:
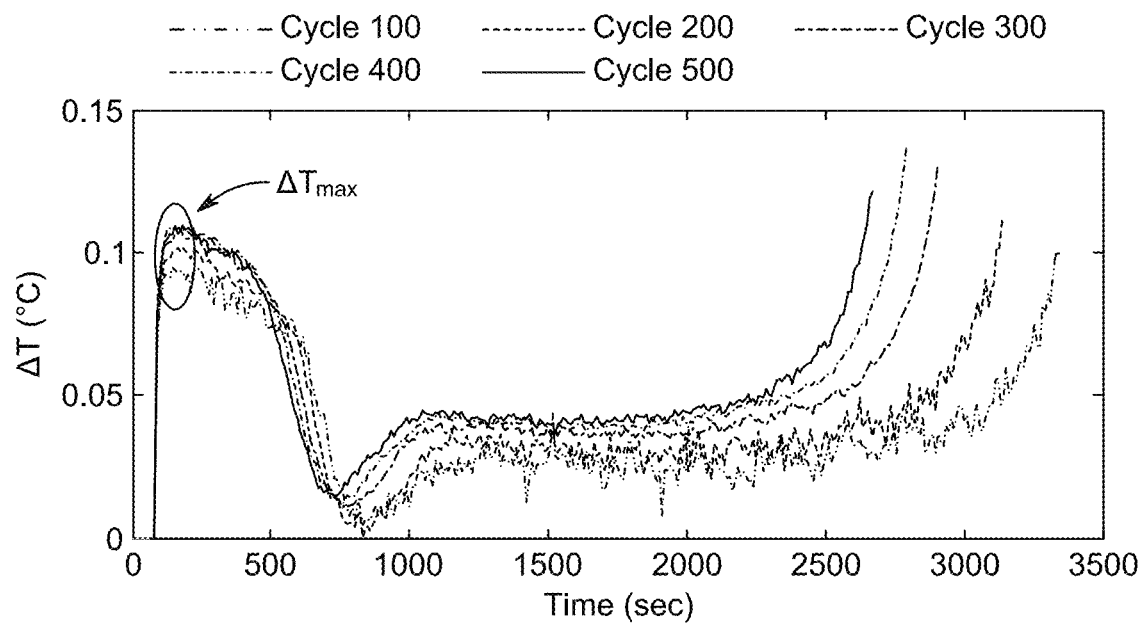
FIG. 5B is an exemplary graph showing differential temperature (47) curves for cycles 100 through 500 for B0007 battery cells, according to certain embodiments.

The differential temperature is plotted in FIGS. 5A and 5B against time during constant-current discharge at different cycles for the tested Li-ion battery cells. In these plots, the high-frequency noise that causes fluctuations in the differential temperature was removed (as will be explained later). For the battery cells used in this study and according to FIGS. 5A and 5B, it was found that at a specific cycle and under constant-current discharge, the differential temperature initially increases to a maximum value ($\Delta T_{max}$) before it falling down to a minimum value, after which it slightly increases and remains almost constant before it rises again exponentially at the end of the discharge. This behavior was noticed in all cycles performed on examined cells as can be seen in FIGS. 5A and 5B.

At step 118, the method 100 includes calculating a maximum differential temperature value from the highest recorded battery cell surface temperature which occurs before the battery cell surface temperature begins to decrease. The maximum differential temperature value is derived from the peak battery cell surface temperature recorded during the constant-current discharge cycle, specifically the highest temperature observed before the battery cell surface temperature begins to decline. This maximum differential temperature value is indicative of the highest thermal deviation from the baseline, or ambient conditions, that the battery experiences due to the internal chemical reactions during discharge. To determine the maximum differential temperature value, continuous or periodic temperature measurements are taken throughout the discharge cycle to monitor the thermal behavior of the battery cell. As the battery discharges, the temperature naturally rises due to internal resistance and the energy conversion process. The point at which the temperature peaks and then begins to fall, marks the maximum thermal response of the battery under the specified discharge conditions. The maximum differential temperature value is representative of the thermal peak of the battery cell, which is correlated with its internal reactions and overall capacity. The maximum differential temperature value, when used in conjunction with other measured parameters, contributes to an empirical model that can accurately estimate the remaining capacity of the battery cell.

At step 120, the method 100 includes determining a differential temperature gain value empirically. The differential temperature gain value is established through experimental observation and analysis of thermal response of the battery cell over a series of charge-discharge cycles. The differential temperature gain value represents the ability of the battery cell to gain temperature relative to the energy being discharged or, in other words, the rate at which the temperature of the battery cell increases per unit of electrical energy discharged. The differential temperature gain value may be calculated by repeatedly cycling the battery cell through charge and discharge phases while recording the temperature responses, and analyzing this data to determine how much the temperature of the battery cell increases for a given amount of electrical energy discharged.

In an embodiment, the differential temperature gain value is determined empirically after at least 100 charge-discharge cycles have been completed and no more than 1000 charge-discharge cycles have been completed. Such empirical determination of the differential temperature gain value after completing a substantial number of charge-discharge cycles establishes a reliable capacity estimation model. This value may be ascertained after the battery has undergone at least 100 cycles, which ensures that the battery is sufficiently aged to provide meaningful data, and no more than 1000 cycles, to avoid the arbitrary effects of excessive wear and potential end-of-life anomalies that could skew the data. The range between 100 and 1000 cycles is chosen to capture a representative spectrum of life of the battery cell, where the effects of aging and usage patterns on thermal behavior of the battery cell are significant enough to be measured, but not so advanced as to introduce excessive variability. This empirical approach ensures that the value is grounded in the actual performance characteristics of the battery cell under normal use conditions.

At step 122, the method 100 includes calculating a capacity parameter from the maximum differential temperature value, the battery temperature rise value, and the differential temperature gain value. Calculating the capacity parameter from the maximum differential temperature value, the battery temperature rise value, and the differential temperature gain value involves utilizing these distinct thermal measurements to obtain a singular metric that can be used to estimate the capacity of the battery cell. As discussed, the maximum differential temperature value represents the peak thermal response of the battery during the discharge process, the battery temperature rise value represents the net change in temperature accounting for the ambient conditions, and the differential temperature gain value represents the empirical relationship between temperature increase and energy discharge of the battery cell. By combining these values, the capacity parameter is calculated in such a way that it incorporates the efficiency and state of health of the battery cell.

In particular, the key in estimating the capacity of the battery cell using the surface temperature measurement is to identify a parameter that can be confidently used to estimate the capacity. Utilizing the two parameters identified in equations (1) and (2), and the new parameter in the form of the differential temperature gain value that has a strong correlation with the capacity, the capacity parameter is calculated as in equation (3) below.

$$x = A_T \Delta T_{max} + T_r \quad (3)$$

where, $A_T$ is the differential temperature gain used to improve the correlation, and is found empirically.

In some cases, a low-pass filter is used to remove high-frequency noise present in the differential temperature value. Specifically, to avoid inaccurate calculation of $\Delta T_{max}$ in equation (3), the low-pass filter is used to remove high-frequency noise which may be present in the differential temperature value. This filtering technique is employed to remove noise that may affect the temperature readings, ensuring that the data represents true thermal responses rather than transient, irrelevant fluctuations. Herein, the low-pass filter uses a subset of differential temperature values to calculate the average differential temperature value at an instant time. That is, the low-pass filter operates by considering the subset of differential temperature values over a period and computes the average differential temperature value at a specific instant in time. This technique smooths out the short-term variations in temperature that are not indicative of actual thermal behavior of the battery cell during the charge-discharge cycle. By averaging the temperature readings over time, the low-pass filter allows only the lower frequency components, which correspond to actual thermal trends, to pass through while effectively attenuating high-frequency noise.

At step 124, the method 100 includes calculating a differential voltage value from the initial battery cell voltage and the final battery cell voltage. This involves using the initial battery cell voltage, which is measured before the start of the constant-current discharge cycle, and the final battery cell voltage, which is measured at the end of the constant-current discharge cycle. The differential voltage value is then determined by subtracting the final battery cell voltage from the initial battery cell voltage. The differential voltage value is an indicator of the electrical energy that has been discharged from the battery cell and is utilized for determining the capacity of the battery cell, as discussed in the proceeding paragraphs.

At step 126, the method 100 includes determining a first capacity coefficient, a second capacity coefficient, and a third capacity coefficient empirically. Such empirical determination of capacity coefficients is employed in the capacity estimation process. The first, second, and third capacity coefficients are derived from experimental data and represent the unique characteristics of a discharge curve of a battery cell. These coefficients relate the thermal and electrical data (specifically, the differential voltage and capacity parameters) to the actual capacity of the battery cell. The coefficients are determined through a series of tests that measure how the capacity of the battery cell changes under various conditions and over time.

At step 128, the method 100 includes calculating the capacity of the battery cell from the differential voltage value, the capacity parameter, the first capacity coefficient, the second capacity coefficient, and the third capacity coefficient. This calculation uses the differential voltage value, the capacity parameter, and the empirically determined capacity coefficients. By integrating these variables into a mathematical model, the capacity of the battery cell can be calculated. Using the parameter in equation (3), a quadratic equation was sufficient to provide accurate estimations for the capacity of the battery cells. The capacity model equation is given in equation (4) below, wherein the model capacity coefficients $a_2$, $a_1$ and $a_0$ are found empirically.

$$C(x) = a_2 x^2 + a_1 x + a_o \quad (4)$$

In the present embodiments, the capacity of the battery cell is determined without fully discharging the battery cell. Further, the capacity of the battery cell is determined without fully charging the battery cell. This approach, of determining the capacity of the lithium-ion battery cell without the necessity for full discharge or full charge, allows for a more practical and less intrusive way to assess the capacity of the battery cell, avoiding the potential negative effects associated with complete charge or discharge cycles, such as accelerated wear and increased stress on the battery cell. Moreover, by enabling capacity determination during partial discharge or charge states, the method 100 facilitates ongoing monitoring and assessment of the performance of the battery cell without interrupting its normal operation or requiring extensive downtime. This approach aligns with real-world usage patterns where batteries are rarely fully charged or discharged during regular operation, providing a more accurate estimation of the capacity of the battery cell under typical conditions.

In some embodiments, the capacity of the battery is determined while the battery is operating at a specific, known operating temperature. This approach recognizes the significant impact that temperature can have on battery performance and capacity, and ensures that the capacity determination is accurate under controlled thermal conditions. This is particularly important for lithium-ion batteries, whose electrochemical performance is highly sensitive to temperature variations. By determining capacity under controlled temperature conditions, the method 100 ensures that the determined capacity is representative of the performance of the battery cell in a consistent thermal environment, thereby minimizing the influence of external temperature fluctuations.

Further, in some embodiments, the capacity of the battery cell is measured at a regular interval and the capacity of the battery cell is recorded in a computer readable medium as a battery cell capacity timestamp. These regular capacity measurements allow for the tracking of changes in performance of the battery cell, which can be indicative of aging, degradation, or other factors. By recording these capacity measurements at predefined intervals, a comprehensive dataset may be generated, providing valuable insight into operational the characteristics and lifecycle of the battery. The recorded capacity measurements may be stored in a computer-readable medium as the battery cell capacity timestamps. This approach ensures that each capacity measurement is associated with a specific point in time, creating a detailed historical record of the capacity of the battery cell over its operation.

Herein, the capacity of the battery cell over time is determined by comparing a first battery cell capacity timestamp against a second battery cell capacity timestamp, the first battery cell capacity timestamp being recorded at a first time and the second battery cell capacity timestamp being recorded at a second time. As may be understood, determining the capacity of the battery cell over time involves a comparative analysis of capacity measurements recorded at different points in the operational timeline of the battery cell. This is achieved by comparing the first battery cell capacity timestamp, recorded at the first time, against the second battery cell capacity timestamp, recorded at the subsequent second time. This comparative method allows for the monitoring of changes in the capacity of the battery cell over time, providing insights into degradation patterns, rate of capacity loss, and overall changes in the health of the battery cell. Further, by analyzing the difference between capacity values at these distinct timestamps, it is possible to estimate the aging process of the battery cell, identify potential issues, and make informed decisions regarding maintenance, charging schedules, and potential replacement.

For purposes of the present disclosure, the capacity of the battery cell may determined and managed by a battery management system. The battery management system may be an electronic system that manages a rechargeable battery cell or battery pack by monitoring its state, calculating secondary data, reporting that data, protecting the battery, controlling its environment, and balancing it. In the present context, one of the primary functions of the battery management system is to accurately determine the capacity of the battery cell, optimizing its performance, ensuring its safety, and extending its lifespan. The battery management system employs the process provided by the present method 100 (as described in the preceding paragraphs), to determine the capacity of battery cell. The battery management system, then, uses the capacity information to make informed decisions regarding charging and discharging processes, energy output, and other operational aspects of the battery cell.

Figure 2:
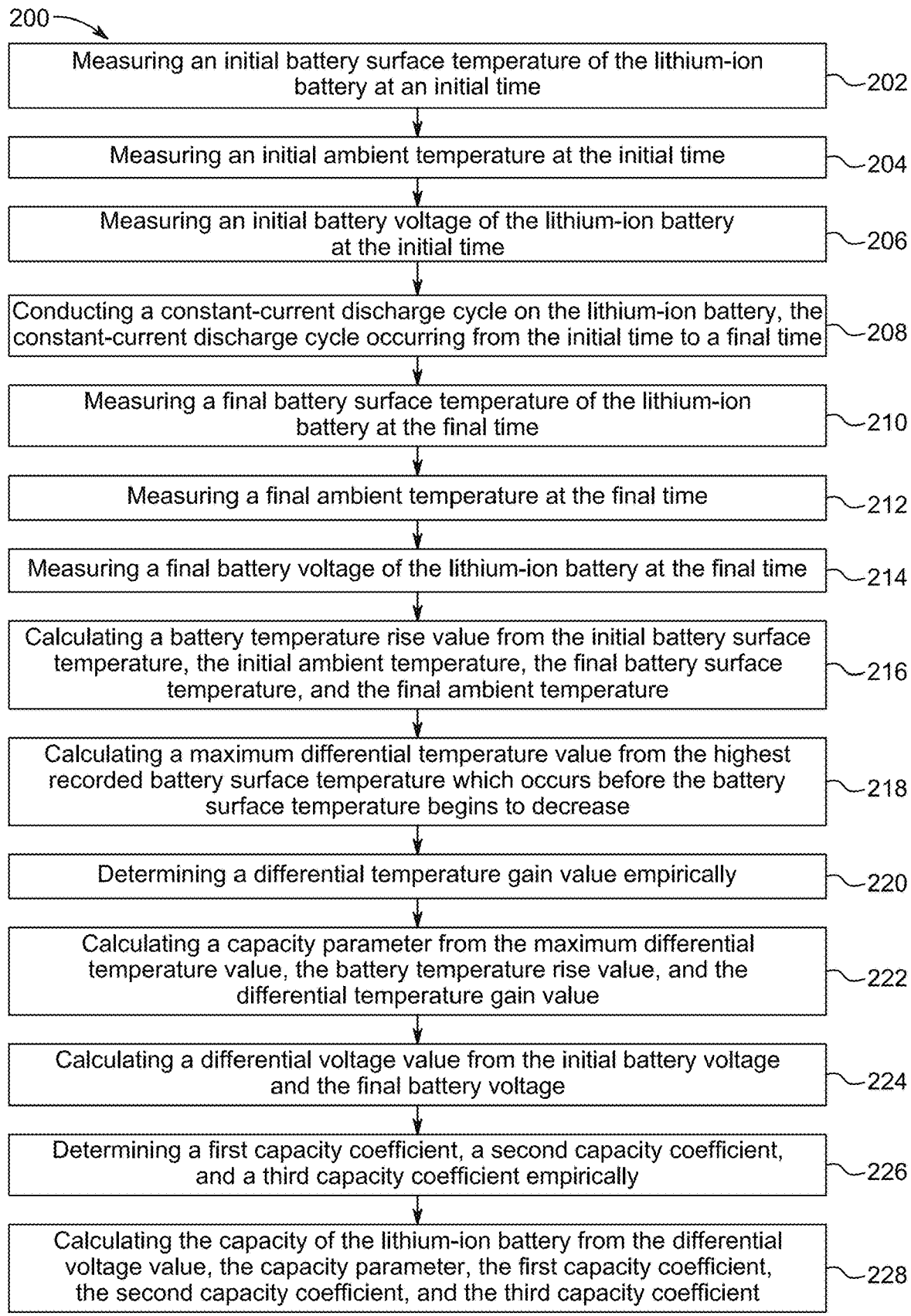
FIG. 2 is an exemplary flowchart listing steps involved in a method for determining the capacity of a lithium-ion battery, according to certain embodiments.

Referring to FIG. 2, illustrated is a flowchart of a method (as represented by reference numeral 200) for determining the capacity of a lithium-ion battery, as per embodiments of the present disclosure. The method 200 specifically relates to determining the capacity of a lithium-ion battery, as opposed to a generic battery cell (as described in reference to the method 100 of FIG. 1), but generally follows the same procedural steps as outlined in method 100. Thus, the description of the steps of the method 200 have been streamlined in the present disclosure to focus on aspects that are particularly pertinent to lithium-ion technology, reflecting its unique electrochemical properties and operational characteristics.

At step 202, the method 200 includes measuring an initial battery surface temperature of a lithium-ion battery at an initial time. At step 204, the method 200 includes measuring an initial ambient temperature at the initial time. At step 206, the method 200 includes measuring an initial battery voltage of the lithium-ion battery at the initial time. Herein, it may be important to consider the thermal management aspects unique to lithium-ion technology. The lithium-ion batteries are particularly sensitive to temperature extremes, which can affect their performance, safety, and longevity. Thus, these initial temperature measurements provide a baseline that is used for evaluating the thermal behavior of the lithium-ion battery during subsequent operations, such as charging or discharging cycles.

At step 208, the method 200 includes conducting a constant-current discharge cycle on the lithium-ion battery, the constant-current discharge cycle occurring from the initial time to a final time. This is particularly suited to lithium-ion batteries due to their specific discharge characteristics and the importance of maintaining controlled conditions to ensure safety and reliability. Specifically, the lithium-ion batteries exhibit a relatively flat discharge curve, meaning their voltage remains stable for a large portion of the discharge cycle before dropping off as the battery nears depletion. By discharging at a constant current, it is possible to observe this voltage behavior and relate it to the capacity of the lithium-ion battery in a controlled and repeatable manner.

At step 210, the method 200 includes measuring a final battery surface temperature of the lithium-ion battery at the final time. At step 212, the method 200 includes measuring a final ambient temperature at the final time. At step 214, the method 200 includes measuring a final battery voltage of the lithium-ion battery at the final time. Given sensitivity of the lithium-ion battery to thermal conditions, the effect of ambient conditions on its performance, and the specific voltage range that need to be maintained to ensure optimal performance and longevity, these final measurements are integral to the capacity determination process, providing the data needed to accurately assess the current state of the lithium-ion battery and to make informed decisions regarding its management and usage.

At step 216, the method 200 includes calculating a battery temperature rise value from the initial battery surface temperature, the initial ambient temperature, the final battery surface temperature, and the final ambient temperature. For lithium-ion batteries, this calculation is particularly significant due to their thermal sensitivity and the impact of temperature on their performance and safety. The battery temperature rise value is determined by subtracting the initial battery surface temperature and the initial ambient temperature from the final battery surface temperature and the final ambient temperature, respectively. At step 218, the method 200 includes calculating a maximum differential temperature value from the highest recorded battery surface temperature which occurs before the battery surface temperature begins to decrease. This value is important for lithium-ion batteries as it can indicate the point at which thermal management systems (if present) of the lithium-ion battery become active, or it may highlight a potential thermal runaway risk if the temperature rise is excessive. At step 220, the method 200 includes determining a differential temperature gain value empirically. For lithium-ion batteries, this empirical determination takes into account the specific heat capacity, thermal conductivity, and other thermal properties unique to lithium-ion chemistry. At step 222, the method 200 includes calculating a capacity parameter from the maximum differential temperature value, the battery temperature rise value, and the differential temperature gain value. This calculated capacity parameter provides comprehensive details about current capacity of the lithium-ion battery, accounting for both electrical and thermal dynamics.

At step 224, the method 200 includes calculating a differential voltage value from the initial battery voltage and the final battery voltage. For lithium-ion batteries, this differential voltage value is particularly important, as the voltage response of these batteries during discharge is relatively flat until they approach their lower voltage limit. This characteristic behavior means that even small changes in voltage can be indicative of significant changes in capacity, making the differential voltage value a sensitive indicator of state of charge and health of the lithium-ion battery. At step 226, the method 200 includes determining a first capacity coefficient, a second capacity coefficient, and a third capacity coefficient empirically. These coefficients are utilized for modeling the relationship between the measured parameters (such as the differential voltage and temperature rise) and actual capacity of the battery. Given the diverse range of chemistries and configurations for lithium-ion batteries, these coefficients may need to be tailored to specific battery type, accounting for its unique charge and discharge characteristics, temperature responses, and aging characteristics. At step 228, the method 200 includes calculating the capacity of the lithium-ion battery from the differential voltage value, the capacity parameter, the first capacity coefficient, the second capacity coefficient, and the third capacity coefficient. With the differential voltage value and capacity parameter available, along with the empirically determined capacity coefficients, the capacity of the lithium-ion battery may be calculated. This calculation integrates the electrochemical and thermal dynamics of the lithium-ion battery, providing an estimate of its remaining energy storage capacity.

In present embodiments, the capacity of the lithium-ion battery is determined without fully charging or fully discharging the lithium-ion battery. This approach is adopted due to the operational constraints of lithium-ion batteries, in which complete charge and discharge cycles are often undesirable due to time constraints, usage patterns, or concerns about shortening their lifespans. In particular, the lithium-ion battery, characterized by its high energy density and sensitivity to full discharge and full charge conditions, benefits from the method 200 as it preserves health and longevity. Avoiding full discharge helps prevent a lithium-ion battery from reaching voltage levels that could trigger undesirable chemical reactions, potentially damaging the battery. Similarly, not fully charging the lithium-ion battery can help avoid stress from being at a high state of charge for extended periods, which can deteriorate the battery.

In an embodiment, a low-pass filter is used to remove the high-frequency noise present in the differential temperature value. Herein, the low-pass filter uses a subset of differential temperature values to calculate the average differential temperature value at an instant time. This ensures that the temperature data used in capacity estimation and other analyses reflects the actual thermal behavior of the lithium-ion battery, rather than transient or spurious noise. For lithium-ion batteries, where thermal management is critical to performance, the role of the low-pass filter role in refining the temperature data supports more reliable capacity estimation, and aids in the detection of potential thermal issues before they escalate.

For the purposes of the present disclosure, the lithium-ion battery is comprised of a plurality of lithium-ion battery cells. That is, the lithium-ion battery includes multiple individual cells connected either in series, parallel, or a combination of both, to meet specific voltage, capacity, or power requirements. Each lithium-ion cell within this assembly contributes to the overall energy storage capacity and output voltage of the lithium-ion battery. This configuration is typical in applications requiring higher power or energy density than a single cell can provide, such as in electric vehicles, portable power tools, and large-scale energy storage systems. The present method 200, by determining the capacity of each cell, helps a battery management system to implement measures to keep the cells within safe operating limits and to balance their state of charge. This ensures that the overall lithium-ion battery operates efficiently, safely, and provides the maximum usable capacity over its lifespan.

Figure 3:
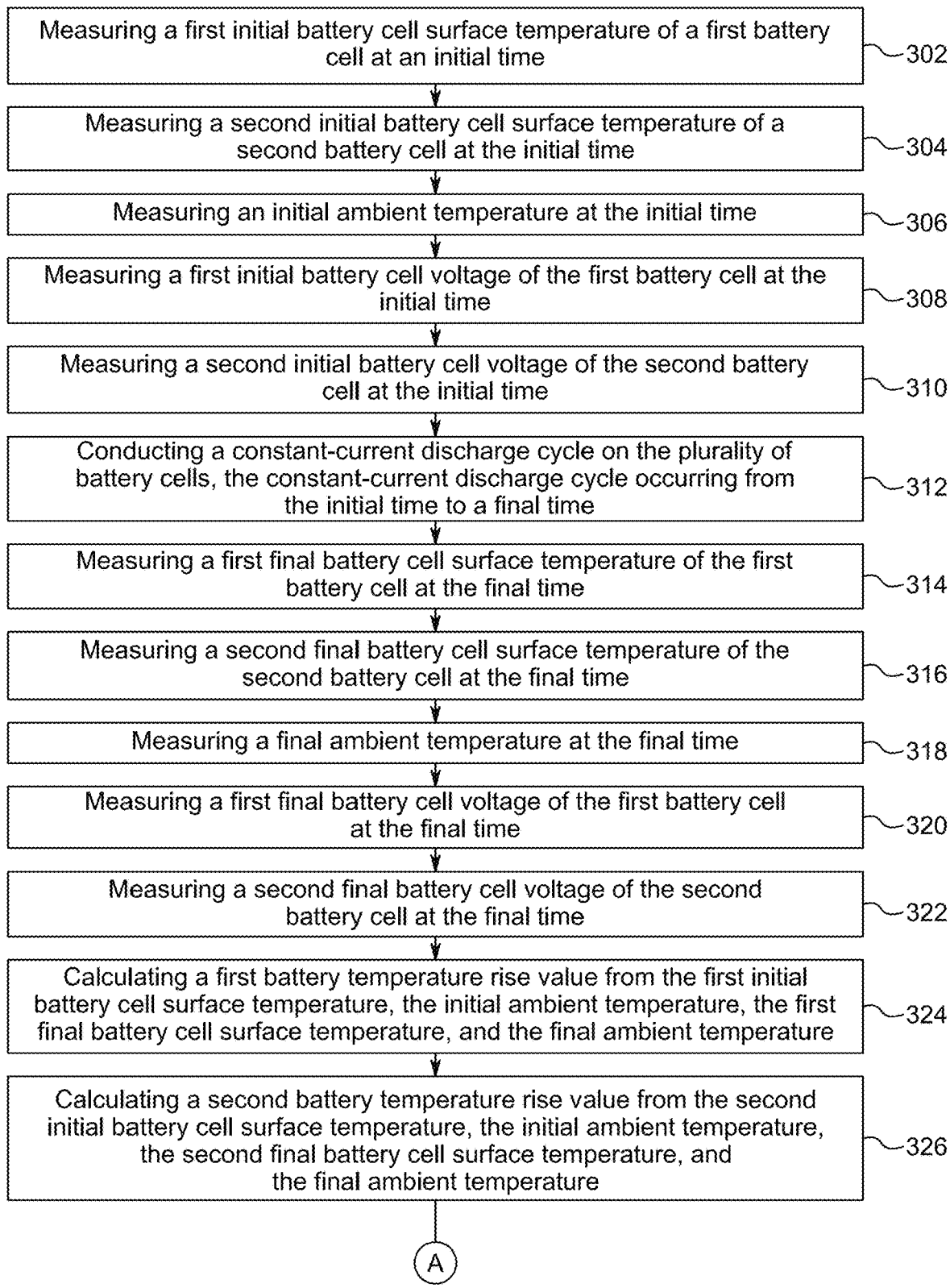
FIG. 3 is an exemplary flowchart listing steps involved in a method for determining the overall capacity of a plurality of battery cells, according to certain embodiments.
Figure 3:
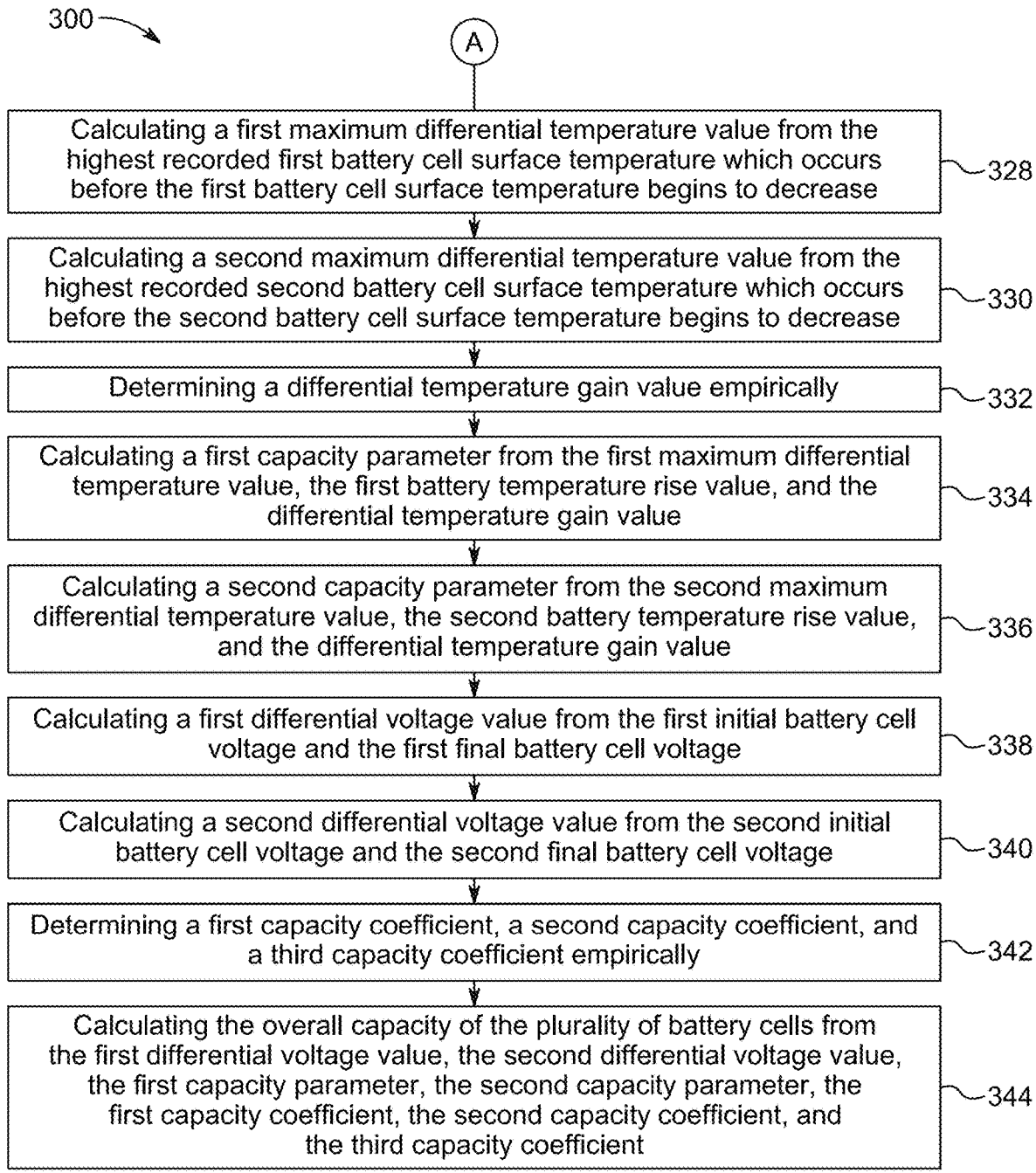

Referring to FIG. 3, illustrated is a flowchart of a method (as represented by reference numeral 300) for determining the overall capacity of a plurality of battery cells, as per embodiments of the present disclosure. The term "plurality of battery cells" refers to a configuration that includes multiple battery cells connected together, typically in series, parallel, or a combination thereof, to achieve desired voltage, capacity, or power outputs. In the context of a plurality of battery cells, the overall capacity refers to the total energy storage capability of the entire battery system. The method 300 is adopted to extend the principles of individual cell capacity determination (as defined in the methods 100 and 200) to a system comprising multiple battery cells. This approach may be implemented for battery packs and modules, where the collective performance and capacity of the battery cells are to be determined. While the method 300 employs the same fundamental steps as the methods 100 and 200, such as measuring temperature, voltage, and applying specific coefficients to estimate capacity, the description has been adapted and expanded to address the complexities and interactions for a multi-cell configuration. Thus, the description of the steps of the method 300 has been streamlined in this disclosure to focus on aspects that are particularly pertinent to a multi-cell configuration. At step 302, the method 300 includes measuring a first initial battery cell surface temperature of a first battery cell at an initial time. At step 304, the method 300 includes measuring a second initial battery cell surface temperature of a second battery cell at the initial time. At step 306, the method 300 includes measuring an initial ambient temperature at the initial time.

At step 308, the method 300 includes measuring a first initial battery cell voltage of the first battery cell at the initial time. At step 310, the method 300 includes measuring a second initial battery cell voltage of the second battery cell at the initial time. This involves synchronously measuring the initial surface temperatures of both the first and second battery cells to establish thermal baselines, and initial voltage measurements for both the first and second battery cells to establish electrical baselines, along with simultaneous measurement of the initial ambient temperature. These synchronous initial measurements across multiple cells allow for assessment of the individual and collective capacities of the battery cells, to determine potential variances in their performance.

At step 312, the method 300 includes conducting a constant-current discharge cycle on the plurality of battery cells, the constant-current discharge cycle occurring from the initial time to a final time. By maintaining a constant discharge current, response of each battery cell to the discharge process may be uniformly evaluated, ensuring that the capacity determination is consistent across all battery cells. This approach is particularly relevant in multi-cell configurations, as it allows for the identification of any cell-specific issues that could affect the overall capacity of the plurality of battery cells.

At step 314, the method 300 includes measuring a first final battery cell surface temperature of the first battery cell at the final time. At step 316, the method 300 includes measuring a second final battery cell surface temperature of the second battery cell at the final time. At step 318, the method 300 includes measuring a final ambient temperature at the final time. At step 320, the method 300 includes measuring a first final battery cell voltage of the first battery cell at the final time. At step 322, the method 300 includes measuring a second final battery cell voltage of the second battery cell at the final time. This involves synchronously measuring the final surface temperatures of both the first and second battery cells at the end of the discharge cycle to capture their thermal responses, alongside final voltage measurements for both the first and second battery cells to determine their electrical states post-discharge. Additionally, the final ambient temperature is measured to account for environmental influences on thermal behavior of the first and second battery cells. These synchronous final measurements across multiple cells enables evaluation of the changes in individual and collective capacities of the plurality of battery cells, providing insights into their performance and the overall efficiency at the end of the discharge process.

At step 324, the method 300 includes calculating a first battery temperature rise value from the first initial battery cell surface temperature, the initial ambient temperature, the first final battery cell surface temperature, and the final ambient temperature. At step 326, the method 300 includes calculating a second battery temperature rise value from the second initial battery cell surface temperature, the initial ambient temperature, the second final battery cell surface temperature, and the final ambient temperature. For the first battery cell, the temperature rise value is determined by comparing its initial surface temperature and the initial ambient temperature with its final surface temperature and the final ambient temperature, respectively. This calculation provides insight into the thermal energy generated by the first cell during the discharge cycle, accounting for environmental temperature influences. Similarly, the second battery temperature rise value is calculated by applying the same comparison to initial and final surface temperatures of the second battery cell against the ambient temperatures. These calculations allow for an assessment of the thermal efficiency and potential internal resistance changes within each battery cell, providing a comparative view of the thermal dynamics and performance of the individual battery cells within the plurality of battery cells.

At step 328, the method 300 includes calculating a first maximum differential temperature value from the highest recorded first battery cell surface temperature which occurs before the first battery cell surface temperature begins to decrease. At step 330, the method 300 includes calculating a second maximum differential temperature value from the highest recorded second battery cell surface temperature which occurs before the second battery cell surface temperature begins to decrease. For the first battery cell, the maximum differential temperature value is calculated by finding the highest recorded surface temperature reached by the cell before its temperature starts to decline, indicating the point of maximum thermal stress or activity. Similarly, the second maximum differential temperature value is calculated by identifying the peak surface temperature for the second battery cell under the same conditions. These values represent the thermal limits and efficiency of each battery cell within the plurality of battery cells, highlighting any potential disparities in thermal management or cell performance that could impact overall effectiveness and reliability.

At step 332, the method 300 includes determining a differential temperature gain value empirically. This process involves collecting and analyzing data from multiple charge-discharge cycles of multiple battery cells in the plurality of battery cells to understand how the temperature of the overall battery, including the plurality of battery cells, responds under different operational conditions. The differential temperature gain value represents the rate at which the temperature of the overall battery increases relative to the amount of electrical energy discharged.

At step 334, the method 300 includes calculating a first capacity parameter from the first maximum differential temperature value, the first battery temperature rise value, and the differential temperature gain value. At step 336, the method 300 includes calculating a second capacity parameter from the second maximum differential temperature value, the second battery temperature rise value, and the differential temperature gain value. For the first battery cell, the capacity parameter is derived from its maximum differential temperature value, which represents the highest thermal peak during discharge, and the first battery temperature rise value, indicating the overall thermal increase relative to the ambient conditions. These are combined with the differential temperature gain value, which has been established empirically to represent the rate of temperature increase per unit of discharged energy across the overall battery. Similarly, the second capacity parameter is calculated using the second maximum differential temperature value and the second battery temperature rise value for the second battery cell, along with the same differential temperature gain value. These capacity parameters serve as indicators of energy storage and delivery efficiency of corresponding battery cells, considering the electrical discharge and the thermal dynamics thereof.

At step 338, the method 300 includes calculating a first differential voltage value from the first initial battery cell voltage and the first final battery cell voltage. At step 340, the method 300 includes calculating a second differential voltage value from the second initial battery cell voltage and the second final battery cell voltage. For the first battery cell, the first differential voltage value is calculated by subtracting the first final battery cell voltage, measured at the end of the discharge cycle, from the first initial battery cell voltage, measured before the discharge began. This value represents the voltage drop across the first battery cell due to the energy discharged during the cycle. Similarly, the second differential voltage value is calculated for the second battery cell by subtracting its final voltage at the end of the discharge cycle from its initial voltage. These differential voltage values aid in assessing the individual performance of each battery cell within the overall battery.

At step 342, the method 300 includes determining a first capacity coefficient, a second capacity coefficient, and a third capacity coefficient empirically. As previously discussed, such an empirical determination process typically includes testing under various conditions, including different charge and discharge rates, temperatures, and states of age. In some cases, regression analysis or other statistical methods may be applied to this data to derive said capacity coefficients. These coefficients are then used in capacity estimation models to calculate the overall capacity of the plurality of battery cells in consideration of the observed operational parameters.

At step 344, the method 300 includes calculating the overall capacity of the plurality of battery cells from the first differential voltage value, the second differential voltage value, the first capacity parameter, the second capacity parameter, the first capacity coefficient, the second capacity coefficient, and the third capacity coefficient. This calculation considers the relationships between the electrical and thermal dynamics of each battery cell, as well as the collective behavior of the battery cells within the overall battery.

For the given multi-cell configuration, in an embodiment, a low-pass filter is used to remove the high-frequency noise present in the differential temperature value, the low-pass filter being configured to use a subset of differential temperature values to calculate an average differential temperature value at an instant time. This configuration is especially relevant when managing the plurality of battery cells, as it ensures that the temperature data across all battery cells is consistent and reliable. These filtered temperature values are integral to calculating the battery temperature rise value, which is then used in conjunction with voltage measurements and empirically determined coefficients to accurately determine the capacity of each battery cell within the plurality of battery cells.

Further, for the given multi-cell configuration, in an embodiment, the plurality of battery cells are lithium-ion battery cells. As discussed, lithium-ion (Li-ion) battery cells are characterized by their high energy density, relatively low self-discharge, and ability to sustain multiple charge-discharge cycles with minimal degradation compared to other battery types. The method 300 of the present disclosure is designed to address the unique characteristics of Li-ion battery cells when combined in the multi-cell configuration, ensuring that determination of capacity of such plurality of battery cells is accurate and reflective of their specific operational behaviors.

Figure 6:
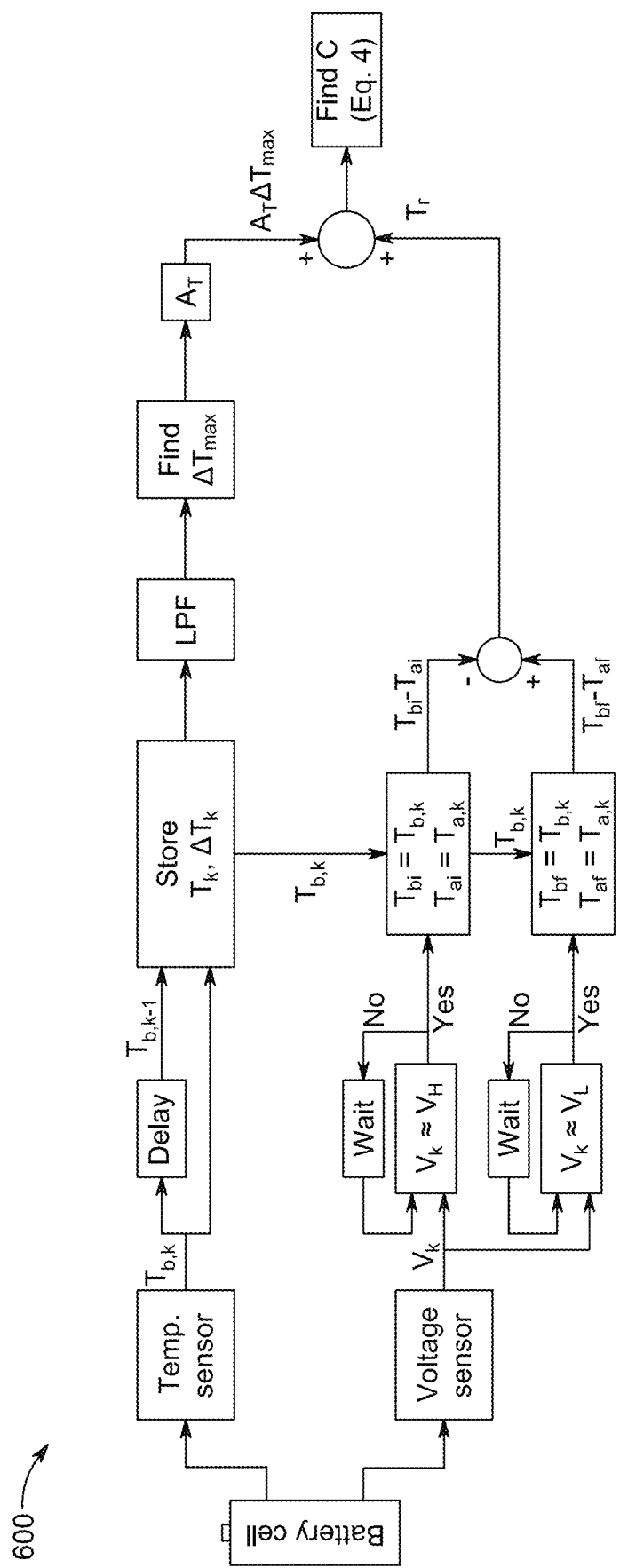
FIG. 6 is an exemplary flow diagram of a process for determining the capacity of a battery cell, according to certain embodiments.

Referring to FIG. 6, illustrated is a flow diagram of a process (as represented by reference numeral 600) for determining the capacity of a battery cell. The process 600 particularly pertains to determining the capacity of a lithium-ion battery. The process 600 provides a sequence of steps including temperature and voltage measurements, data processing through a delay and storage mechanism, application of a low-pass filter, and other mathematical calculations to calculate the capacity of the battery cell. Each block of the process 600 represents a specific operation in a sequence that collectively enables the precise calculation of the capacity of the battery cell, in consideration of the various physical and chemical processes occurring within the cell during operation.

The process 600 includes a block representing a delay, symbolizing the temporal storage or lag of data as it is collected. Further, there is a storage function where the temperature rise ($T_r$) and the change in temperature over time ($\Delta T_k$) are calculated according to the provided equations (1) and (2). This step is utilized to track the change in temperature of the battery cell in response to the discharge process. Next, the data passes through a low-pass filter (LPF), which is utilized to remove high-frequency noise from the temperature data, thereby ensuring that only the true signal representing the relevant thermal behavior of the battery cell is analyzed. The LPF is configured to use a subset of the last recorded differential temperature values to ascertain an average differential temperature at any given moment, as suggested by the equation (3) provided.

A subsequent operation in the process 600 is the identification of the maximum differential temperature value ($\Delta T_{max}$), for understanding the peak thermal stress experienced by the battery cell during the discharge cycle. Finally, the process 600 ends in a calculation block where capacity (C) of the battery cell is determined by applying the identified capacity coefficients ($a_0$, $a_1$, $a_2$) in the quadratic equation (4). This equation integrates the thermal data processed through the LPF and the maximum differential temperature to provide an assessment of the capacity of the battery cell.

Figure 7A:
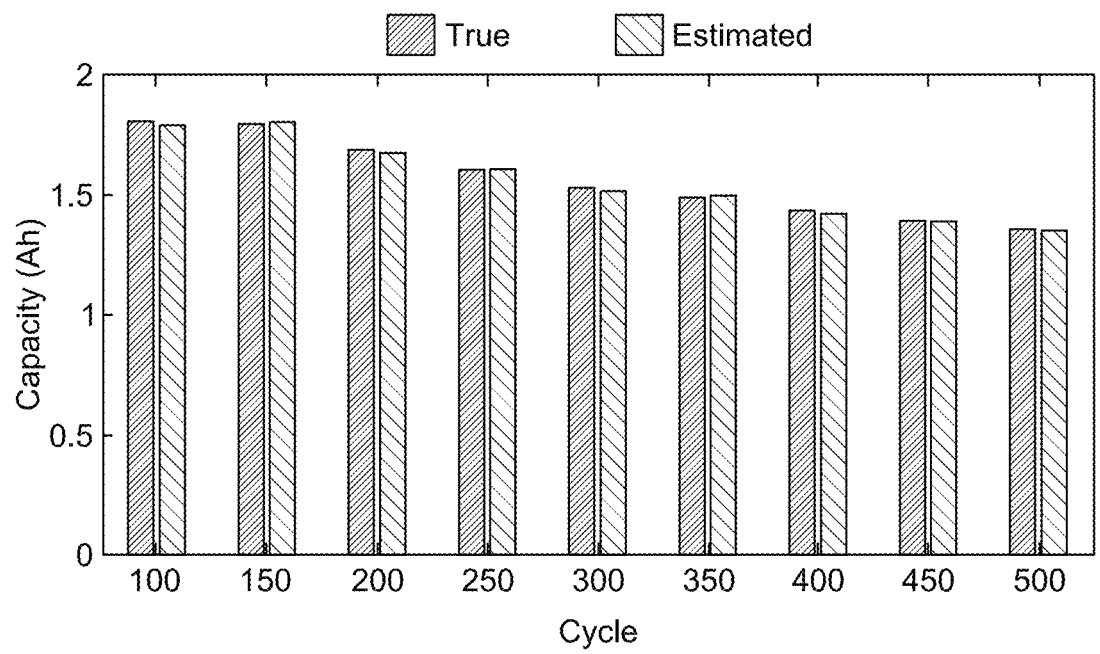
FIG. 7A is an exemplary graph showing capacity estimation results for B0005 battery cells, according to certain embodiments.
Figure 7B:
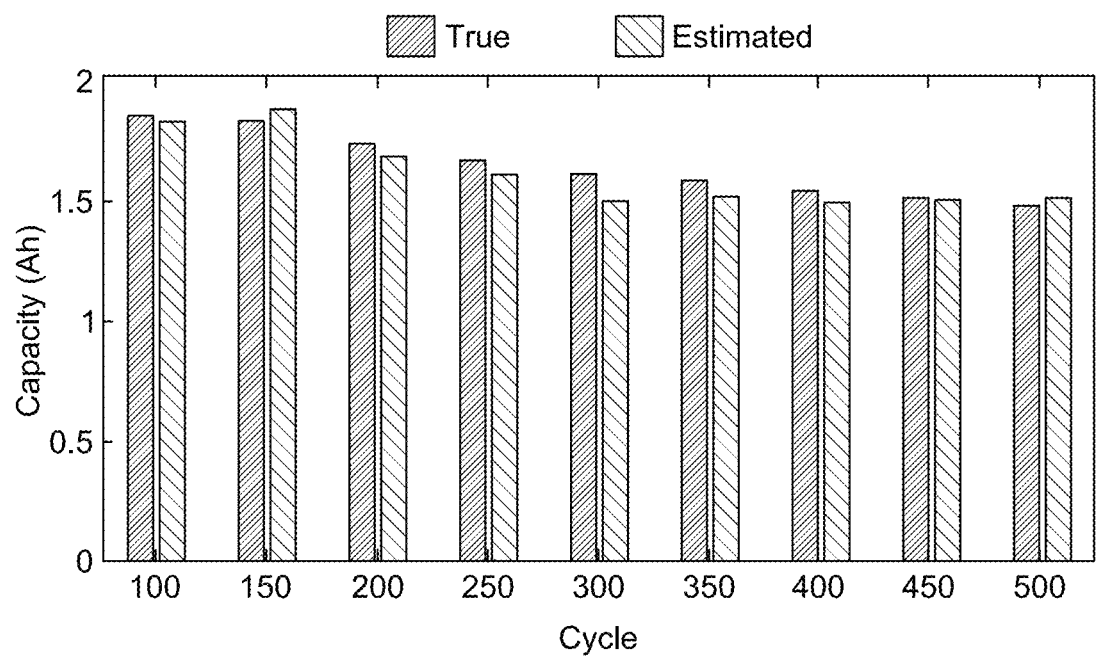
FIG. 7B is an exemplary graph showing capacity estimation results for B0007 battery cells, according to certain embodiments.

Referring to FIGS. 7A and 7B, the results of estimating the capacity of two tested battery cells over the first 500 cycles are shown. The bar charts compare the actual measured capacity (denoted as "True") against the estimated capacity (denoted as "Estimated") for each cycle. The capacity values are presented in ampere-hours (Ah), providing a quantitative measure of the energy storage capability of the battery cells at each cycle. As may be seen, the close alignment between the true and estimated values across the cycling life of the battery cells demonstrates the effectiveness of the proposed estimation methods of the present disclosure. In FIG. 7A, the capacity estimation for the first battery cell is shown, with the results indicating a consistent level of precision in the estimation process across all cycles. Similarly, FIG. 7B shows the capacity estimation for the second battery cell, which also indicates a high degree of accuracy in the estimation process when compared to the actual measured values. The consistency in the estimated capacity suggests that the methods 100, 200, 300 employed for capacity estimation are robust and reliable, capable of accurately predicting the capacity of battery cells as they undergo repeated cycling.

The methods 100, 200, 300 of the present disclosure facilitate the calculation of the capacity of battery cell(s), factoring in operational temperatures and health thereof. The proposed techniques avoid the requirement for full charge or discharge cycles and the utilization of complex, computationally intensive algorithms characteristic of model-based or data-driven techniques. The present methods 100, 200, 300 provide a cost-efficient approach to accurately determine the capacity of a battery cell over its operational lifespan. The methods 100, 200, 300 are designed for easy integration with existing battery management systems, making these versatile for application across various battery products and diverse industrial sectors. The proposed techniques require a minimal number of components and provide assessment on a limited set of direct measurements. Specifically, the present methods 100, 200, 300 may only need information about surface temperature and voltage of the battery cell, both of which may be measured reliably using cost-effective sensors affixed to the battery cell. These attributes underscore the contribution of the methods 100, 200, 300 in providing a practical, reliable, and economically viable alternative for battery capacity estimation.

Figure 8:
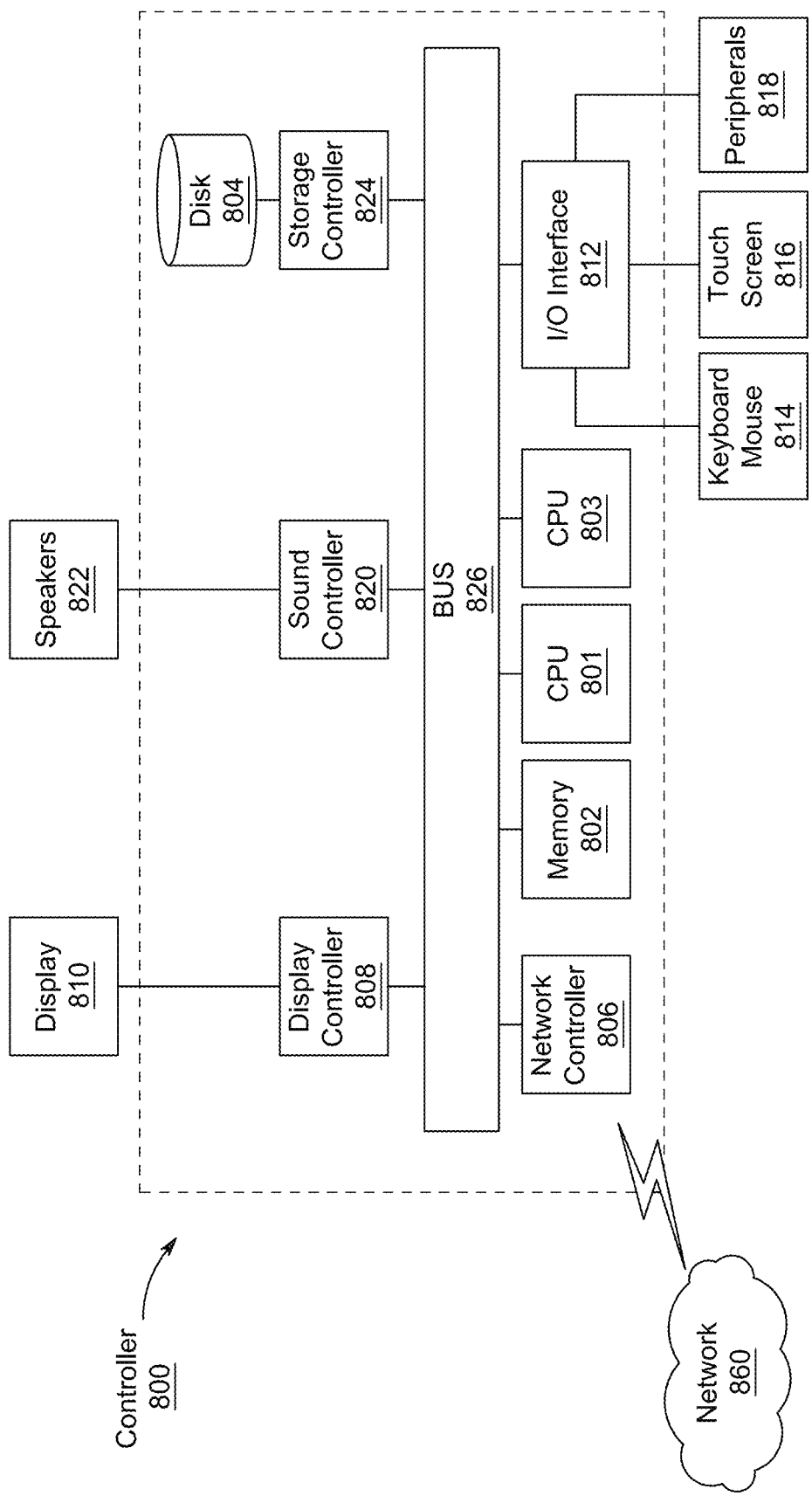
FIG. 8 is an illustration of a non-limiting example of the component details of computing hardware used in a computing system for determining battery capacity, according to certain embodiments.

Next, further details of the hardware description of the computing environment according to exemplary embodiments is described with reference to FIG. 8. In FIG. 8, a controller 800 is described in which the controller is a computing device which includes a CPU 801 which performs the processes described above/below. The process data and instructions may be stored in memory 802. These processes and instructions may also be stored on a storage medium disk 804 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 801, 803 and an operating system such as Microsoft Windows 7, Microsoft Windows 8, Microsoft Windows 10, UNIX, Solaris, LINUX, Apple MAC-OS, and other systems known to those skilled in the art.

The hardware elements in order to achieve the computing device may be realized by various circuitry elements, known to those skilled in the art. For example, CPU 801 or CPU 803 may be a Xenon or Core processor from Intel of America or an Opteron processor from AMD of America, or may be other processor types that would be recognized by one of ordinary skill in the art. Alternatively, the CPU 801, 803 may be implemented on an FPGA, ASIC, PLD or using discrete logic circuits, as one of ordinary skill in the art would recognize. Further, CPU 801, 803 may be implemented as multiple processors cooperatively working in parallel to perform the instructions of the inventive processes described above.

The computing device in FIG. 8 also includes a network controller 806, such as an Intel Ethernet PRO network interface card from Intel Corporation of America, for interfacing with network 860. As can be appreciated, the network 860 can be a public network, such as the Internet, or a private network such as an LAN or WAN network, or any combination thereof and can also include PSTN or ISDN subnetworks. The network 860 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 808, such as a NVIDIA GeForce GTX or Quadro graphics adaptor from NVIDIA Corporation of America for interfacing with display 810, such as a Hewlett Packard HPL2445w LCD monitor. A general purpose I/O interface 812 interfaces with a keyboard and/or mouse 814 as well as a touch screen panel 816 on or separate from display 810. General purpose I/O interface also connects to a variety of peripherals 818 including printers and scanners, such as an OfficeJet or DeskJet from Hewlett Packard.

A sound controller 820 is also provided in the computing device such as Sound Blaster X-Fi Titanium from Creative, to interface with speakers/microphone 822 thereby providing sounds and/or music.

The general purpose storage controller 824 connects the storage medium disk 804 with communication bus 826, which may be an ISA, EISA, VESA, PCI, or similar, for interconnecting all of the components of the computing device. A description of the general features and functionality of the display 810, keyboard and/or mouse 814, as well as the display controller 808, storage controller 824, network controller 806, sound controller 820, and general purpose I/O interface 812 is omitted herein for brevity as these features are known in the art.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 9.

Figure 9:
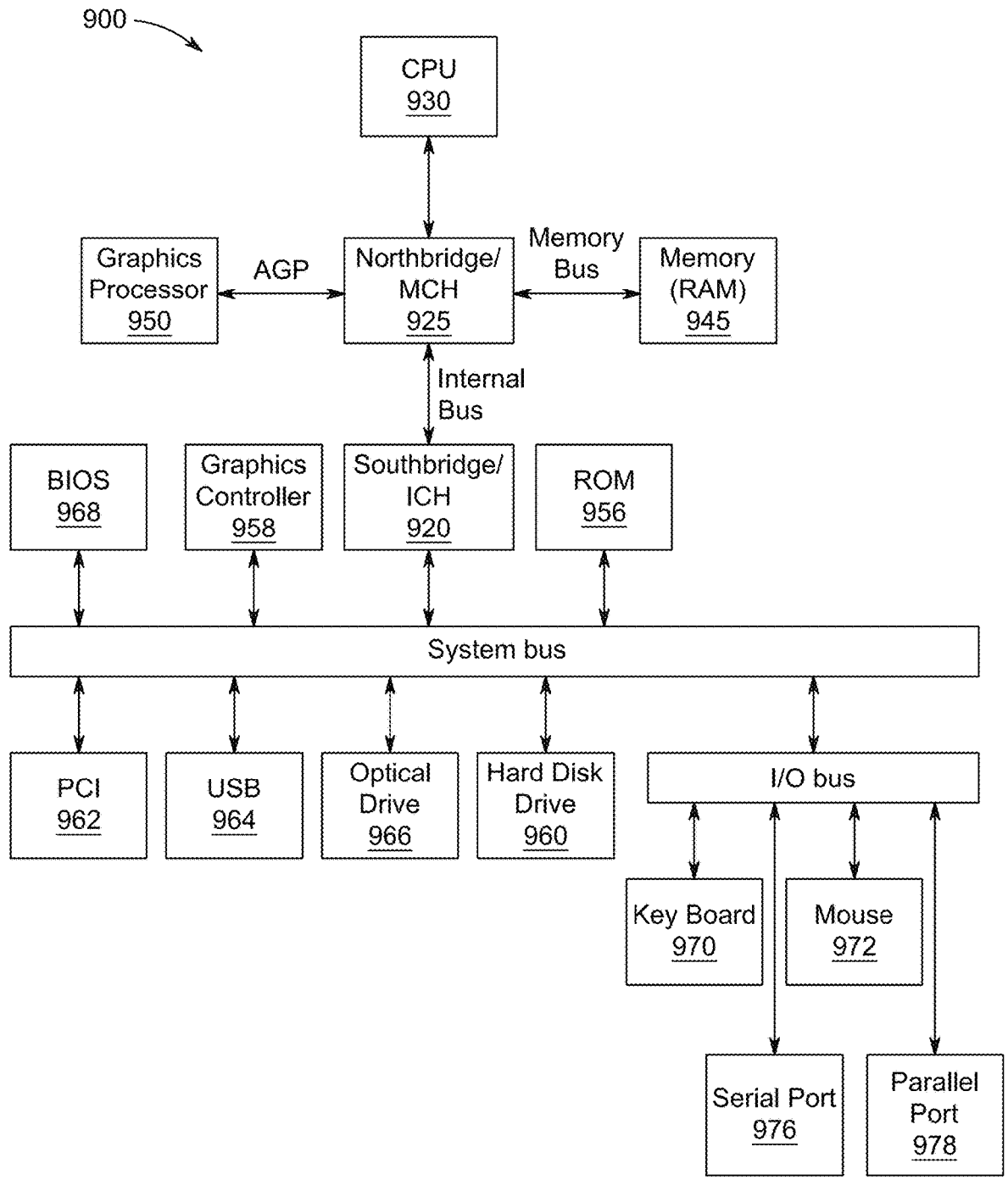
FIG. 9 is an exemplary schematic diagram of a data processing system used within a computing system for determining battery capacity, according to certain embodiments.

FIG. 9 shows a schematic diagram of a data processing system, according to certain embodiments, for performing the functions of the exemplary embodiments. The data processing system is an example of a computer in which code or instructions implementing the processes of the illustrative embodiments may be located.

In FIG. 9, a data processing system 900 employs a hub architecture including a north bridge and memory controller hub (NB/MCH) 925 and a south bridge and input/output (I/O) controller hub (SB/ICH) 920. The central processing unit (CPU) 930 is connected to NB/MCH 925. The NB/MCH 925 also connects to the memory 945 via a memory bus, and connects to the graphics processor 950 via an accelerated graphics port (AGP). The NB/MCH 925 also connects to the SB/ICH 920 via an internal bus (e.g., a unified media interface or a direct media interface). The CPU Processing unit 930 may contain one or more processors and even may be implemented using one or more heterogeneous processor systems.

Figure 10:
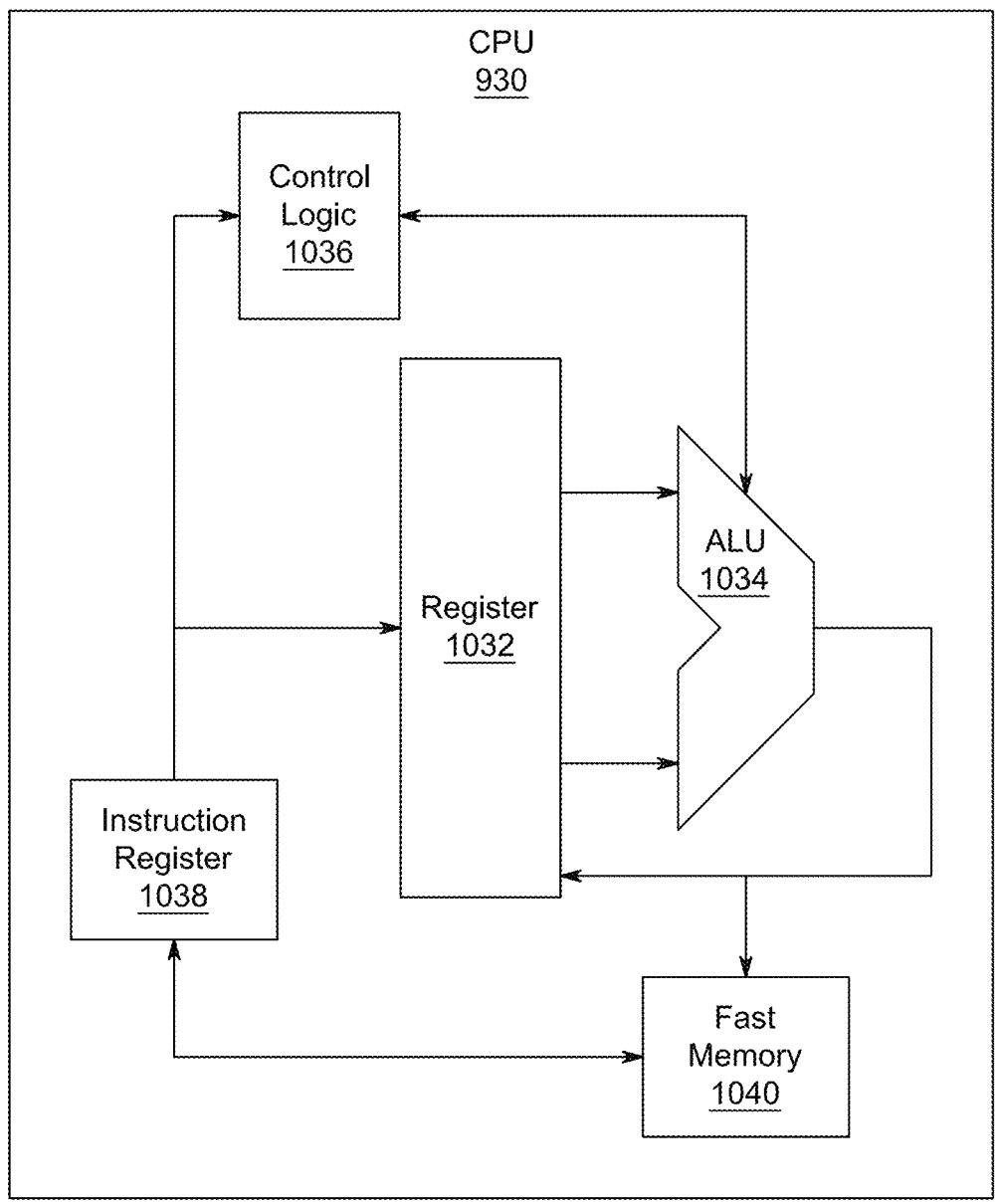
FIG. 10 is an exemplary schematic diagram of a processor used with a computing system for determining battery capacity, according to certain embodiments.

For example, FIG. 10 shows one implementation of CPU 930. In one implementation, the instruction register 1038 retrieves instructions from the fast memory 1040. At least part of these instructions are fetched from the instruction register 1038 by the control logic 1036 and interpreted according to the instruction set architecture of the CPU 930. Part of the instructions may also be directed to the register 1032. In one implementation, the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1034 that loads values from the register 1032 and performs logical and mathematical operations on the loaded values according to the instructions. The results from these operations can be fed back into the register and/or stored in the fast memory 1040. According to certain implementations, the instruction set architecture of the CPU 930 can use a reduced instruction set architecture, a complex instruction set architecture, a vector processor architecture, and/or a very large instruction word architecture. Furthermore, the CPU 930 can be based on the Von Neuman model or the Harvard model. The CPU 930 can be a digital signal processor, an FPGA, an ASIC, a PLA, a PLD, or a CPLD. Further, the CPU 930 can be an x86 processor by Intel or by AMD; an ARM processor, a Power architecture processor by, e.g., IBM; a SPARC architecture processor by Sun Microsystems or by Oracle; or any other known CPU architecture.

Referring again to FIG. 9, the data processing system 900 can include that the SB/ICH 920 is coupled through a system bus to an I/O Bus, a read only memory (ROM) 956, universal serial bus (USB) port 964, a flash binary input/output system (BIOS) 968, and/or a graphics controller 958. PCI/PCIe devices can also be coupled to SB/ICH 988 through a PCI bus 962.

The PCI devices may include, for example, Ethernet adapters, add-in cards, and PC cards for notebook computers. The Hard disk drive 960 and CD-ROM 966 can use, for example, an integrated drive electronics (IDE) or serial advanced technology attachment (SATA) interface. In one implementation the I/O bus can include a super I/O (SIO) device.

Further, the hard disk drive (HDD) 960 and optical drive 966 can also be coupled to the SB/ICH 920 through a system bus. In one implementation, a keyboard 970, a mouse 972, a parallel port 978, and a serial port 976 can be connected to the system bus through the I/O bus. Other peripherals and devices may be connected to the SB/ICH 920 using a mass storage controller such as SATA or PATA, Ethernet, an ISA bus, a LPC bridge, SMBus, a DMA controller, or an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes in battery sizing and chemistry, or based on the requirements of the intended back-up load to be powered.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A method for determining the capacity of a battery cell, the method comprising:
measuring an initial battery cell surface temperature of the battery cell at an initial time;
measuring an initial ambient temperature at the initial time;
measuring an initial battery cell voltage of the battery cell at the initial time;
conducting a constant-current discharge cycle on the battery cell, the constant-current discharge cycle occurring from the initial time to a final time;
measuring a final battery cell surface temperature of the battery cell at the final time;
measuring a final ambient temperature at the final time;
measuring a final battery cell voltage of the battery cell at the final time;
calculating a battery temperature rise value from the initial battery cell surface temperature, the initial ambient temperature, the final battery cell surface temperature, and the final ambient temperature;
calculating a maximum differential temperature value from the highest recorded battery cell surface temperature which occurs before the battery cell surface temperature begins to decrease;
determining a differential temperature gain value empirically;
calculating a capacity parameter from the maximum differential temperature value, the battery temperature rise value, and the differential temperature gain value;
calculating a differential voltage value from the initial battery cell voltage and the final battery cell voltage;
determining a first capacity coefficient, a second capacity coefficient, and a third capacity coefficient empirically; and
calculating the capacity of the battery cell from the differential voltage value, the capacity parameter, the first capacity coefficient, the second capacity coefficient, and the third capacity coefficient.

2. The method of claim 1, wherein the differential temperature gain value is determined empirically after at least 100 charge-discharge cycles have been completed and no more than 1000 charge-discharge cycles have been completed.

3. The method of claim 1, wherein the battery cell is a lithium-ion battery cell.

4. The method of claim 2, wherein a low-pass filter is used to remove high-frequency noise present in the differential temperature value.

5. The method of claim 4, wherein the low-pass filter uses a subset of differential temperature values to calculate the average differential temperature value at an instant time.

6. The method of claim 1, wherein the capacity of the battery cell is determined without fully discharging the battery cell.

7. The method of claim 6, wherein the capacity of the battery cell is determined without fully charging the battery cell.

8. The method of claim 1, wherein the capacity of the battery is determined while the battery is operating at a specific, known operating temperature.

9. The method of claim 1, wherein the capacity of the battery cell is measured at a regular interval and the capacity of the battery cell is recorded in a computer readable medium as a battery cell capacity timestamp.

10. The method of claim 9, wherein the capacity of the battery cell over time is determined by comparing a first battery cell capacity timestamps against a second battery cell capacity timestamp, the first battery cell capacity timestamp being recorded at a first time and the second battery cell capacity timestamp being recorded at a second time.

11. The method of claim 1, wherein the capacity of the battery cell is determined by a battery management system.

12. The method of claim 1, wherein the initial battery cell surface temperature, the final battery cell surface temperature, the initial ambient temperature, and the final ambient temperature are measured with the same temperature sensor.

13. A method for determining the capacity of a lithium-ion battery, the method comprising:
measuring an initial battery surface temperature of the lithium-ion battery at an initial time;
measuring an initial ambient temperature at the initial time;
measuring an initial battery voltage of the lithium-ion battery at the initial time;
conducting a constant-current discharge cycle on the lithium-ion battery, the constant-current discharge cycle occurring from the initial time to a final time;
measuring a final battery surface temperature of the lithium-ion battery at the final time;

measuring a final ambient temperature at the final time;
measuring a final battery voltage of the lithium-ion battery at the final time;
calculating a battery temperature rise value from the initial battery surface temperature, the initial ambient temperature, the final battery surface temperature, and the final ambient temperature;
calculating a maximum differential temperature value from the highest recorded battery surface temperature which occurs before the battery surface temperature begins to decrease;
determining a differential temperature gain value empirically;
calculating a capacity parameter from the maximum differential temperature value, the battery temperature rise value, and the differential temperature gain value;
calculating a differential voltage value from the initial battery voltage and the final battery voltage;
determining a first capacity coefficient, a second capacity coefficient, and a third capacity coefficient empirically; and
calculating the capacity of the lithium-ion battery from the differential voltage value, the capacity parameter, the first capacity coefficient, the second capacity coefficient, and the third capacity coefficient.

14. The method of claim 13, wherein a low-pass filter is used to remove the high-frequency noise present in the differential temperature value.

15. The method of claim 14, wherein the low-pass filter uses a subset of differential temperature values to calculate the average differential temperature value at an instant time.

16. The method of claim 13, wherein the capacity of the lithium-ion battery is determined without fully charging or fully discharging the lithium-ion battery.

17. The method of claim 13, wherein the lithium-ion battery is comprised of a plurality of lithium-ion battery cells.

18. A method for determining the overall capacity of a plurality of battery cells, the method comprising:
measuring a first initial battery cell surface temperature of a first battery cell at an initial time;
measuring a second initial battery cell surface temperature of a second battery cell at the initial time;
measuring an initial ambient temperature at the initial time;
measuring a first initial battery cell voltage of the first battery cell at the initial time;
measuring a second initial battery cell voltage of the second battery cell at the initial time;
conducting a constant-current discharge cycle on the plurality of battery cells, the constant-current discharge cycle occurring from the initial time to a final time;
measuring a first final battery cell surface temperature of the first battery cell at the final time;
measuring a second final battery cell surface temperature of the second battery cell at the final time;
measuring a final ambient temperature at the final time;
measuring a first final battery cell voltage of the first battery cell at the final time;
measuring a second final battery cell voltage of the second battery cell at the final time;
calculating a first battery temperature rise value from the first initial battery cell surface temperature, the initial ambient temperature, the first final battery cell surface temperature, and the final ambient temperature;
calculating a second battery temperature rise value from the second initial battery cell surface temperature, the initial ambient temperature, the second final battery cell surface temperature, and the final ambient temperature;
calculating a first maximum differential temperature value from the highest recorded first battery cell surface temperature which occurs before the first battery cell surface temperature begins to decrease;
calculating a second maximum differential temperature value from the highest recorded second battery cell surface temperature which occurs before the second battery cell surface temperature begins to decrease;
determining a differential temperature gain value empirically;
calculating a first capacity parameter from the first maximum differential temperature value, the first battery temperature rise value, and the differential temperature gain value;
calculating a second capacity parameter from the second maximum differential temperature value, the second battery temperature rise value, and the differential temperature gain value;
calculating a first differential voltage value from the first initial battery cell voltage and the first final battery cell voltage;
calculating a second differential voltage value from the second initial battery cell voltage and the second final battery cell voltage;
determining a first capacity coefficient, a second capacity coefficient, and a third capacity coefficient empirically; and
calculating the overall capacity of the plurality of battery cells from the first differential voltage value, the second differential voltage value, the first capacity parameter, the second capacity parameter, the first capacity coefficient, the second capacity coefficient, and the third capacity coefficient.

19. The method of claim 18, wherein the plurality of battery cells are lithium-ion battery cells.

20. The method of claim 18, wherein a low-pass filter is used to remove the high-frequency noise present in the differential temperature value, the low-pass filter being configured to use a subset of differential temperature values to calculate an average differential temperature value at an instant time.

* * * * *